United States Patent
Azuma

[11] Patent Number: 5,485,128
[45] Date of Patent: Jan. 16, 1996

[54] OSCILLATION CIRCUIT HAVING A CURRENT-CONTROLLED PHASE SHIFT CIRCUIT

[75] Inventor: Kunihiko Azuma, Tokyo, Japan

[73] Assignee: NEC Corporation, Japan

[21] Appl. No.: 349,959

[22] Filed: Dec. 6, 1994

[30] Foreign Application Priority Data

Dec. 7, 1993 [JP] Japan ................................ 5-306850

[51] Int. Cl.⁶ .................................................. H03B 5/32
[52] U.S. Cl. ...................... 331/135; 327/243; 327/248; 327/250; 327/252; 331/158; 331/177 R
[58] Field of Search ......................... 331/116 R, 116 FE, 331/117 R, 117 FE, 108 B, 135, 158, 177 R; 327/237, 243, 248, 250, 252

[56] References Cited

U.S. PATENT DOCUMENTS 4,733,200  3/1988  Ecklund et al. .................. 331/116 R
5,115,212  5/1992  Fenk et al. ....................... 331/177 R

*Primary Examiner*—Siegfried H. Grimm
*Attorney, Agent, or Firm*—Hayes, Soloway, Hennessey, Grossman & Hage

[57] ABSTRACT

An oscillator circuit including a current-controlled phase shift circuit and a feedback circuit including a quartz resonator is capable of varying the oscillation frequency in accordance with control current signals. A phase shift circuit included in the current-controlled phase shift circuit includes a first low-pass filter including a resistor and a capacitor, a first buffer amplifier, a second low-pass filter including a resistor and a capacitor, and a second buffer amplifier. The phase shift circuit has a significant gain at any frequency for oscillation. Especially an oscillation circuit implemented by an integrated circuit satisfies the suitable condition in which relative value of resistances and capacitances do not vary.

9 Claims, 18 Drawing Sheets

PRIOR ART

OSCILLATION CIRCUIT HAVING A CURRENT-CONTROLLED PHASE SHIFT CIRCUIT

BACKGROUND OF THE INVENTION (a) Field of the Invention

The present invention relates to an oscillation circuit having a current-controlled phase shift circuit and, more particularly, to an improvement in a current-controlled phase shift circuit combined with a feedback circuit including a quartz resonator, for use in recovering a subcarrier for a color signal.

(b) Description of Related Art

An oscillation circuit is generally used for a television set, a video tape recorder etc. implemented, for example, by an integrated circuit. Referring to FIG. 1, there is shown a conventional oscillation circuit comprising a current-controlled phase shift circuit 20 which amplifies a first signal e1 input through an input terminal 1 and outputs an output signal e5 through an output terminal 2 while shifting the phase of the first signal e1 in accordance with control signals supplied to control terminals 12 and 13. The oscillation circuit also includes a feedback circuit 21 connected between the output terminal 2 and the input terminal 1 of the current-controlled phase shift circuit 20 to receive the signal e5 from the phase shift circuit 20 through a terminal 3 and feed the first signal e1 back to the input terminal 1 of the current-controlled phase shift circuit 20 through a terminal 4.

The current-controlled phase shift circuit 20 comprises a voltage source E1 having a positive terminal connected to the input terminal 1 via a resistor R2, a phase shift circuit 10 or phase delay circuit which receives first signal e1 input to the input terminal 1 and outputs signal e2 having a phase delay relative to the phase of signal e1 by 90°, a first limiter circuit 6 which receives signal e2 from the phase delay circuit 10 and outputs a first current signal i1 after amplifying and limiting the amplitude of signal e2, a second limiter circuit 11 which also receives the first signal e1 and outputs a second current signal i2 having a polarity and an amplitude which are controlled in accordance with the control current signals supplied through control terminals 12 and 13, a resistor R3 having a first terminal connected to both the outputs of the first and second limiter circuits 6 and 11 at node n1 and a second terminal connected to power supply line Vcc, and an output section 7 implemented as an amplifier which has an input connected to node n1 and an output connected to the output terminal 2 of the current-controlled phase shift circuit 20.

The first signal e1 supplied to the input terminal 1 of the current-controlled phase shift circuit 20 is biased by a DC bias voltage supplied from the voltage source E1 through resistor R2, then supplied to the input of the phase delay circuit 10 and the input of the second limiter circuit 11.

Referring to FIG. 2, the phase delay circuit 10 in FIG. 1 comprises a first low-pass filter 1005 formed by a resistor R12 and a capacitor C6, a first buffer amplifier 1003 for driving the low-pass filter 1005, a second low-pass filter 1006 formed by a resistor R13 and a capacitor C7, and a second buffer amplifier 1004 for eliminating interference between the first and the second low-pass filters 1005 and 1006. The overall characteristic of the phase shift circuit 10 from the input terminal 1001 to the output terminal 1002 thereof is that of a second order low-pass filter. The resistance of resistor R12 is selected equal to the resistance of resistor R13, while the capacitance of capacitor C6 is selected equal to the capacitance of capacitor C7. Also, the gains of the buffer amplifiers 1003 and 1004 are both set at 1. Accordingly, the transfer function $A(\omega)$ of the phase delay circuit 10 is expressed by the following equation (1):

$$A(\omega) = \frac{1}{\left(1 + j\frac{\omega}{\omega_o}\right)^2} \quad (1)$$

wherein $\omega$ represents an angular frequency of the input signal, and $\omega_o$ represents a natural angular frequency of the phase delay circuit and is expressed as:

$$\omega_o = (2\pi \cdot C6 \cdot R12)^{-1} = (2\pi \cdot C7 \cdot R13)^{-1}.$$

From equation (1), the amplitude characteristic $20 \cdot \log|A(\omega)|$ and the phase characteristic $\angle A(\omega)$ of the transfer function $A(\omega)$ are obtained as follows:

$$20 \cdot \log|A(\omega)| = 20 \cdot \log(1 + \omega^2/\omega_o^2) \quad (2)$$

$$\angle A(\omega) = -2 \cdot \tan^{-1}(\omega/\omega_o). \quad (3)$$

FIGS. 3 and 4 show the characteristics of transfer function $A(\omega)$ represented by equations (2) and (3) in the vicinity of $\omega/\omega_o = 1$. As shown in FIG. 4, the phase delay circuit 10 functions for phase shifting of −90° when the ratio $\omega/\omega_o$ is 1, i.e., when the angular frequency $\omega$ is equal to the natural angular frequency $\omega_o$. As shown in FIG. 3, the amplitude of the output signal decreases by about 6 dB when the angular frequency $\omega$ is equal to the natural angular frequency $\omega_o$ as compared to the case of a DC signal. Output signal e2 from the phase delay circuit 10 is supplied to the first limiter circuit 6, as shown in FIG. 1.

Referring to FIG. 5, the first limiter circuit 6 is implemented by a differential amplifier formed by transistors Q3 and Q4 and a constant current source I1. The base and collector of transistor Q3 are connected to an input terminal 601 and an output terminal 602, respectively. The collector of transistor Q4 is connected to power supply line Vcc while the base thereof is connected to the positive electrode of voltage source E4, the negative electrode of which is grounded. The emitters of transistors Q3 and Q4 are connected with each other, and the current source I1 is connected between the connected emitters and ground. The voltage of the voltage source E4 connected to the base of transistor Q4 is set equal to the voltage of the voltage source E1 which supplies the DC bias voltage to the input terminal 1 of the current-controlled phase shift circuit 20. With this structure, the DC bias voltage biasing signal e2, which is supplied from the phase shift circuit 10 through terminal 601, is cancelled so that the differential amplifier operates in accordance only with signal e2.

Since the amplitude of the output signal e2 from the phase shift circuit 20 is set so that the differential amplifier formed by transistors Q3 and Q4 functions for a complete switching operation, the collector current of transistor Q3 output through terminal 602 has a rectangular waveform with an amplitude I1 at any time, even when the amplitude of signal e2 varies to some extent. The amplitude of the fundamental wave component i1 of the rectangular wave current depends only on the amplitude of the rectangular wave current, and is therefore determined by the current supplied from the current source I1 regardless of the amplitude of signal e2. Accordingly, the amplitude $A_{i1}$ of the fundamental wave component i1 of the rectangular wave current is constant and expressed as follows:

$$A_{l1} = \frac{2}{\pi} \cdot I_1. \quad (4)$$

Moreover, the fundamental wave component i1 is opposite in phase with respect to signal e2, with the direction of current flowing out of terminal 602 being positive.

Referring to FIG. 6, the second limiter circuit 11 comprises a first differential amplifier formed by transistors Q5 and Q6, and a second differential amplifier formed by transistors Q7 and Q8. Both of the base of transistor Q5 and the base of transistor Q8 are connected to an input terminal 1101, both of the collector of transistor Q6 and the collector of transistor Q8 are connected to an output terminal 1102, and both of the collector of transistor Q5 and the collector of transistor Q7 are connected to power supply line Vcc. A node n2 connecting the emitters of transistors Q5 and Q6 with each other is connected to a first control terminal 1103, while a node n3 connecting the emitters of transistors Q7 and Q8 with each other is connected to a second control terminal 1104. A voltage source E5 is connected between a node n4 connecting the bases of transistors Q6 and Q7 with each other and ground.

Since the voltage of the voltage source E5 connected to the bases of transistors Q6 and Q7 is set equal to the voltage of the voltage source E4 in the first limiter circuit 6, the DC bias voltage biasing the first signal e1, which is input to terminal 1101, is cancelled so that the differential amplifier operates in accordance only with the first signal e1. Since the amplitude of signal e1 is greater than that of signal e2, the differential amplifiers formed by transistors Q5 and Q6 and by transistors Q7 and Q8, respectively, function for a complete switching operation, similarly to the first limiter circuit 6. The node n2 is supplied with a first control current I3 via control terminal 12, while the node n3 is supplied with a second control current I4 via a second control terminal 13. Similarly to the first limiter circuit 6, the amplitude $A_{i2}$ of the fundamental wave component i2 of collector current flowing from the collectors of transistors Q6 and Q8 can be expressed in terms of the control currents I3 and I4 as follows:

$$A_{i2} = 2 \cdot (I3 - I4)/\pi. \quad (5)$$

Here, the control currents I3 and I4 can be expressed as I3=K·I1, I4=(1−K)·I1 wherein K is a parameter (0<K<1), indicating that the control currents I3 and I4 are controlled according to the parameter K. From these relationships, equation (5) can be rewritten as follows:

$$A_{i2} = 2 \cdot (2K - 1) \cdot I1/\pi. \quad (6)$$

The right-hand side of equation (6) is negative when the inequality 0<K<½ holds. In such a case, the phase of the fundamental wave component i2 of the second current signal I2 is reversed from the phase of first signal e1. In the case where the inequality ½<K<1 holds, the fundamental wave component i2 is in phase with first signal e1.

Fundamental wave components i1 and i2 of output current I1 from the first limiter circuit 6 and output current I2 from the second limiter circuit 11 are directly added together, and the resultant current signal is then converted to a voltage signal by a resistor R3. The voltage signal is output from output terminal 2 of the current-controlled phase shift circuit 20 as an output signal e5 via the output amplifier 7 having a gain of 1, then input to the input terminal 3 of the feedback circuit 21.

The feedback circuit 21 comprises a series circuit of resistor R1 and quartz resonator X connected between input terminal 3 and output terminal 4 of the feedback circuit 21, and a capacitor C1 connected between output terminal 4 of the feedback circuit 21 and ground. The transfer function H(ω) of the feedback circuit 21 has the characteristics shown in FIGS. 7 and 8 in the vicinity of the serial resonance angular frequency $\omega_S$ peculiar to the quartz resonator X and the parallel resonance angular frequency $\omega_P$ slightly higher than $\omega_S$. FIG. 7 shows the phase characteristic $\angle H(\omega)$ of the feedback circuit 21 as a function of angular frequency. In the vicinity of $\omega_S$ at which the phase delay is 90°, the phase of the output signal varies linearly with respect to variation in angular frequency ω. The term "angular frequency" will be called merely "frequency" hereinafter for the sake of simplification.

FIG. 8 shows the amplitude characteristic of the feedback circuit 21 as a function of frequency. As shown in FIG. 8, a band-pass characteristic is obtained in the feedback circuit 21 wherein the transfer gain 20·log|H(ω)| reaches a maximum in the vicinity of $\omega_S$. The frequencies $\omega_S$ and $\omega_P$ are very close to each other so that expression $(\omega_P - \omega_S)/\omega_S$ assumes a value around $10^{-3}$. When the natural frequency $\omega_o$ of the phase delay circuit 10 is selected equal to the series resonace frequency $\omega_s$, the output of the phase shift circuit 10 exhibits a substantially constant phase delay of −90° in the narrow frequency range between $\omega_S$ and $\omega_P$. In other words, the phase of signal e2 is delayed by 90° relative to signal e1 in FIG. 1. The phase of the fundamental wave component i1 from the first limiter circuit 6 leads by 90° from the phase of signal e1, since the fundamental wave component i1 is opposite in phase with respect to the phase of signal e2. From equation (6), it is understood that the fundamental wave component i2 is opposite in phase with respect to signal e1 when the inequality 0<K<½ holds, and is in phase with respect to signal e1 when the inequality ½<K<1 holds. In addition, the absolute value of the fundamental wave component i2 does not exceed the fundamental wave component i1 as expressed by equation (4).

With the characteristics as described above, it is possible to shift the phase of signal e5 (=i1·R3+i2·R3), which is obtained by summing the components i1 and i2 and converting the resultant sum to a voltage signal by resistor R3 and which is output through the output terminal 2, from the phase of signal e1, by an angle from +45° through 90° to +135°, in accordance with the parameter K. The phase relationship among the signals e1, e2 and e5 is shown in FIG. 9, wherein the phase of signal e1 is shown as 0°. Since the parameter K varies in accordance with control currents supplied through control terminals 12 and 13, the current-controlled phase shift circuit 20 can lead the phase of output signal e5, with respect to the phase of input signal e1, within the angle range between +45° and +135°, as shown by broken lines in FIG. 9.

According to the frequency-amplitude characteristic of the feedback circuit 21 shown in FIG. 8, the gain in terms of ratio of output signal at the output terminal 4 of the feedback circuit 21 to input signal at the input terminal 1 of the current-controlled phase shift circuit 20 is selected at a large value in a selected frequency range between ω− and ω+. Accordingly, a positive feedback signal having an amplitude sufficient for starting an oscillation in the oscillation circuit is input to the current-controlled phase shift circuit 20 from the output terminal 4 of the feedback circuit 21, provided that the signal frequency lies in the range between ω− and ω+.

On the other hand, the frequency at which output signal of the positive feedback signal remains in phase with input signal thereof is selected as an oscillation frequency at one point within the frequency range between ω– and ω+, the oscillation frequency being determined in accordance with the phase of output signal from the current-controlled phase shift circuit 20 and the frequency-phase characteristic of the feedback circuit 21 shown in FIG. 7. Accordingly, oscillation is started at the selected frequency point by the function of the positive feedback loop circuit formed by the feedback circuit 21 and the current-controlled phase shift circuit 20. Hence, the conventional oscillation circuit shown in FIG. 1 acts as an oscillation circuit capable of varying the oscillation frequency within the range between ω– and ω+ in accordance with currents supplied through control terminals 12 and 13.

In the conventional oscillation circuit as described above, the phase delay circuit 10 for obtaining a phase delay of 90° is implemented by a secondary order low-pass filter in which time constant is set so that a phase delay of 90° is selected at the series resonance frequency of the quartz resonator X in the feedback circuit 21 outside the phase shift circuit. As a result, if the quartz resonator X is replaced by another quartz resonator having a different natural frequency so as to alter the oscillation frequency, the phase delay obtained by the low-pass filter is not 90° at the series resonance frequency of the new quartz resonator, so that the variable range of the output of the current-controlled phase shift circuit 20 deviates from the range between +45° and +135°. Accordingly, the frequency at which input of the current controlled phase shift circuit 20 remains in phase with the output of the feedback circuit 21 deviates from the frequencies at which the feedback circuit 21 exhibits the band-pass characteristic. Hence, the gain of the positive feedback loop formed by the current-controlled phase shift circuit 20 and the feedback circuit 21 decreases, whereby the oscillation of the oscillation circuit is possibly stopped.

In addition, since the time constant of the phase shift circuit 10 is determined by resistors and capacitors implemented in a semiconductor integrated circuit, the phase delay obtained by the phase delay circuit 10 varies due to variations in the resistances of resistors and the capacitances of the capacitors even if the phase delay circuit 10 is designed to have an exact phase delay of 90° at the series resonance frequency of the quartz resonator X. As a result, control characteristics regarding the phase of output of the current control phase shift circuit 20 is varied. Accordingly, the frequency at which the input of the current-controlled phase shift circuit 20 remains in phase with the output of the feedback circuit 21 varies, resulting in variation of the oscillation frequency.

SUMMARY OF THE INVENTION

In view of the foregoing, it is an object of the present invention to provide an oscillation circuit in which variation in the oscillation frequency due to variation in the phase characteristic of a phase shift circuit is reduced.

An oscillation circuit according to the present invention comprises: a phase shift circuit, including a low-pass filter having a significant transfer gain at any frequency, for receiving a first signal to output a second signal having a first phase shift relative to the phase of the first signal, the phase shift being substantially different from 90°; a first limiter circuit for receiving the second signal to output a third signal having a first amplitude and remaining in phase with the second signal; a second limiter circuit for receiving the first signal and a control signal to output a fourth signal, the fourth signal being in phase with the first signal and having a second amplitude controlled by the control signal; adding section for adding the second signal and the fourth signal to output a fifth signal; and a feedback circuit, including a resonance circuit having a resonant frequency within the frequency band, for receiving the fifth signal to output the first signal having a second phase shift relative to the phase of the fifth signal, the second phase shift being a function of the frequency of the fifth signal.

The principle of the present invention will be exemplarily described for a better understanding of the present invention.

It is assumed that the transfer function $A(\omega)$ of the phase shift circuit is expressed in terms of $\omega_1$, $\omega_2$, $\omega_3$, $\omega_4$ and A as follows:

$$A(\omega) = \frac{A\left(\left(1+\frac{\omega}{\omega_2}\right)\left(1+\frac{\omega}{\omega_4}\right)\right)}{\left(1+\frac{\omega}{\omega_1}\right)\left(1+\frac{\omega}{\omega_3}\right)}$$

wherein $\omega_1$, $\omega_2$, $\omega_3$ and $\omega_4$ are positive real numbers different from each other, and A is a real number. By appropriately selecting the real numbers $\omega_1$, $\omega_2$, $\omega_3$ and $\omega_4$, the phase characteristic of the transfer function is set such that a constant phase shift substantially different from of –90°, e.g. about –45° is obtained within a predetermined frequency band. Accordingly, even when the oscillation frequency is substantially changed, for example, by replacing a quartz resonator in a feedback circuit, the oscillation can be effected, while maintaining the variability of the oscillation frequency in accordance with control signals, provided that the series resonance frequency of the quartz resonator remains in the predetermined frequency band.

Moreover, the real numbers ω1, ω2, ω3, and ω4 can be set such that the phase shift circuit provides a constant phase delay of about –45°, even when ω1, ω2, ω3 and ω4 providing the phase characteristic of the phase shift circuit are changed while maintaining a constant ratio between each two of the real numbers. Accordingly, even if the resistances of resistors and the capacitances of capacitors, which define a time constant for each of the real numbers ω1, ω2, ω3 and ω4, change as a whole while maintaining a constant ratio between resistors and capacitances, the phase characteristic of the phase shift circuit is maintained to provide a constant phase delay of about –45°.

In accordance with the present invention, if a new oscillation frequency is to be selected in the oscillation circuit by changing a series resonant frequency in the feedback circuit, the oscillation can be effected while maintaining the the newly selected oscillation frequency in accordance with the control signals. Accordingly, the oscillation circuit of the present invention attains a stable oscillation.

Especially in the case where the oscillation circuit is formed as a semiconductor integrated circuit, the phase characteristic of the phase shift circuit is maintained to provide a constant phase delay of about –45° regardless of variations as a whole in the resistances of resistors and the capacitances of capacitors which define the time constants. Accordingly, variation in the oscillation frequency due to variation in the phase characteristic can be reduced in the semiconductor integrated circuit implementing the oscillation circuit according to the present invention.

BRIEF DESCRIPTION OF THE DRAWINGS

The above and other objects, features and advantages of the invention will become more apparent from the following description, taken in conjunction with accompanying drawings in which.

PREFERRED EMBODIMENTS OF THE INVENTION

Figure 10:
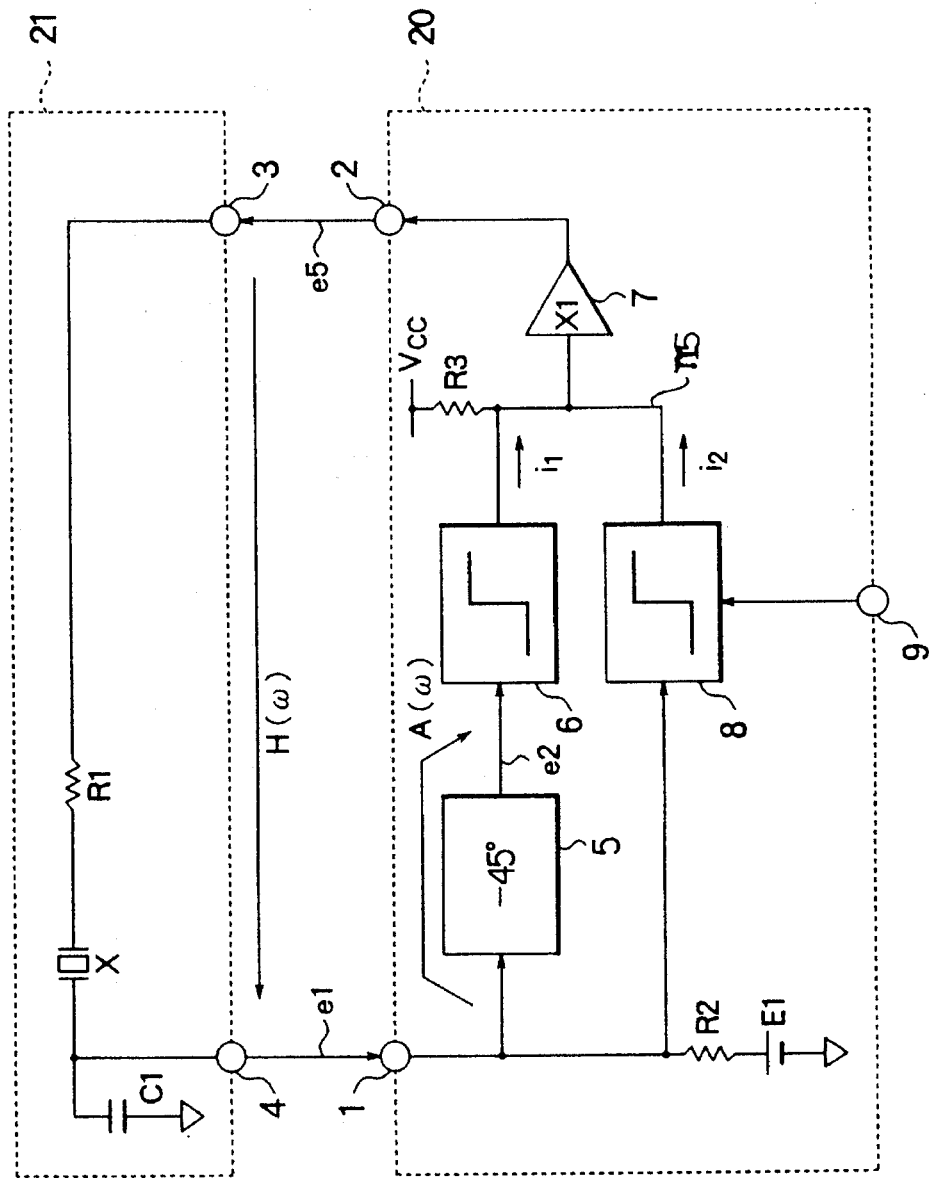
FIG. 10 is a block diagram of an oscillation circuit according to a first embodiment of the present invention.
Figure 11:
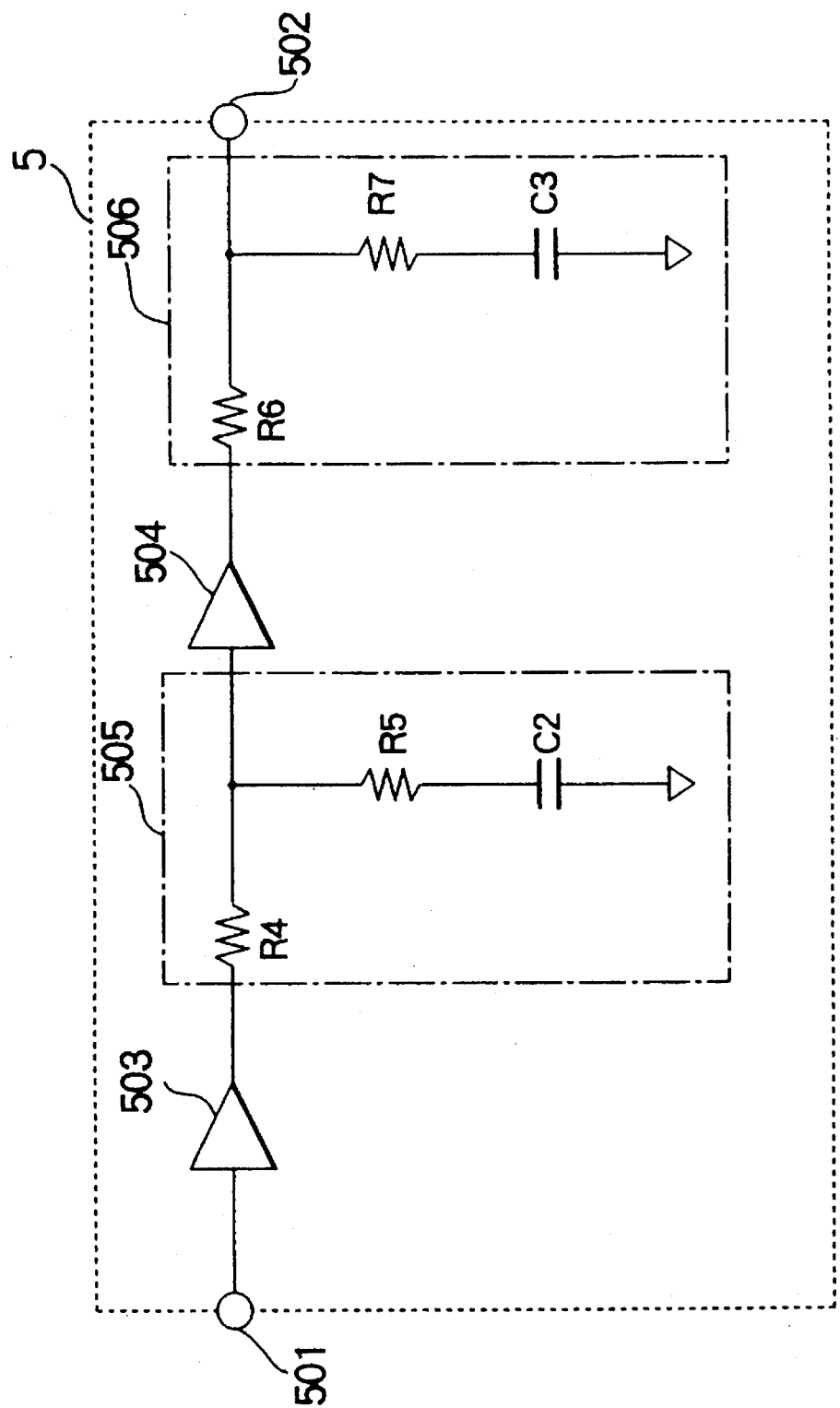
FIG. 11 is a circuit diagram of a phase delay circuit 5 shown in FIG. 10.

Referring to FIGS. 10 and 11, there are shown a block diagram of an oscillation circuit according to a first embodiment of the present invention, and a circuit diagram of the phase shift circuit or phase delay circuit 5, respectively. Circuit blocks having functions similar to those of corresponding circuit blocks in the conventional oscillation circuit are designated by similar or the same reference numerals, for the sake of understanding.

The oscillation circuit of FIG. 10 comprises a current-controlled phase shift circuit 20 which amplifies a first signal e1 input through an input terminal 1 thereof and outputs an output signal e5 through an output terminal 2 thereof while shifting the phase of the first signal in accordance with control signals supplied to a control terminal 9. The oscillation circuit also includes a feedback circuit 21 connected between the output terminal 2 and the input terminal 1 of the current-controlled phase shift circuit 20 to receive the output signal e5 from the current-controlled phase shift circuit 20 through a terminal 3 and feed the first signal e1 back to the input terminal 1 of the current-controlled phase shift circuit 20 through a terminal 4.

The current-controlled phase shift circuit 20 comprises a voltage source E1 having a positive terminal connected to input terminal 1 via a resistor R2, a phase shift circuit 5 which receives first signal e1 and outputs second signal e2 after delaying the phase of signal e1 substantially by 45°, a first limiter circuit 6 which receives second signal e2 from the phase delay circuit 5 and outputs a first current signal (third signal) including a fundamental wave current i1 after amplifying and limiting the amplitude of signal e2, a second limiter circuit 8 which also receives first signal e1 and outputs a second current signal (fourth signal) including a fundamental wave current i2 having an amplitude controlled in accordance with a single control signal supplied to control terminal 9, a resistor R3 having a first terminal connected to both the outputs of the first and second limiter circuits 6 and 8 at node n5 and a second terminal connected to power supply line Vcc, and an output section 7 implemented as an amplifier which has a unity gain and has an input connected to node n5 and an output connected to the output terminal 2 of the current-controlled phase shift circuit 20. Resistor R3 functions as an adder for adding the outputs of the first limiter circuit 6 and the second limiter circuit 8.

The first signal e1 supplied to the input terminal 1 of the current-controlled phase shift circuit 20 is biased by a DC bias voltage supplied from voltage source E1 through resistor R2, then supplied both to the input of the phase delay circuit 5 and to the input of the second limiter circuit 8.

As shown in FIG. 11, a phase delay circuit 5 comprises a first low-pass filter 505 formed by resistor R4 and a series of resistor R5 and a capacitor C2, a first buffer amplifier 503 for supplying the first filter 505 with a signal input to an input terminal 501 receiving first signal e1 biased by DC bias voltage, a second buffer amplifier 504 receiving output from the first filter 505 for amplification, and a second low-pass filter connected between the output of the second buffer amplifier 504 and an output terminal 502. The second low-pass filter 506 is formed by resistor R6 and a series of resistor R7 and a capacitor C3. The gain of the second buffer amplifier 504 is set at 8 (=+18 dB), and the transfer function $A(\omega)$ of the phase delay circuit 5 as viewed from input terminal 501 to output terminal 502 is expressed as follows:

$$A(\omega) = 8 \cdot \frac{1 + j\omega C2 \cdot R5}{1 + j\omega C2 \cdot (R4 + R5)} \cdot \frac{1 + j\omega C3 \cdot R7}{1 + j\omega C3 \cdot (R6 + R7)} \quad (7)$$

where C2·R4, C2·R5, C3·R6, and C3·R7 are selected based on the series resonance frequency $\omega_S$ of a quartz resonator X and constants a and b (a>b>1) as follows:

$$C2 \cdot R4 = (a - b) \cdot \frac{1}{\omega_s} \quad (8)$$

$$C2 \cdot R5 = b \cdot \frac{1}{\omega_s} \quad (9)$$

$$C3 \cdot R6 = \left(\frac{1}{b} - \frac{1}{a}\right) \frac{1}{\omega_s} \quad (10)$$

$$C3 \cdot R7 = \frac{1}{a} \cdot \frac{1}{\omega_s} . \quad (11)$$

From the above relationship, the amplitude characteristic (20·log|$A(\omega)$|) and the phase characteristic ($\angle A(\omega)$) of the transfer function $A(\omega)$ of the phase delay circuit 5 can be expressed as follows:

$$20 \cdot \log |A(\omega)| = \quad (12)$$

-continued $$10 \cdot \log 2\sqrt{2} \cdot \frac{1 + \left(\frac{b\omega}{\omega_s}\right)^2}{1 + \left(\frac{a\omega}{\omega_s}\right)^2} \cdot \frac{1 + \left(\frac{\omega}{a\omega_s}\right)^2}{1 + \left(\frac{\omega}{b\omega_s}\right)^2}$$

$$\angle A(\omega) = \tag{13}$$

$$-\tan^{-1}\left(\frac{a\omega}{\omega_s}\right) + \tan^{-1}\left(\frac{b\omega}{\omega_s}\right) - \tan^{-1}\left(\frac{\omega}{b\omega_s}\right) + \tan^{-1}\left(\frac{\omega}{a\omega_s}\right).$$

Figure 12:
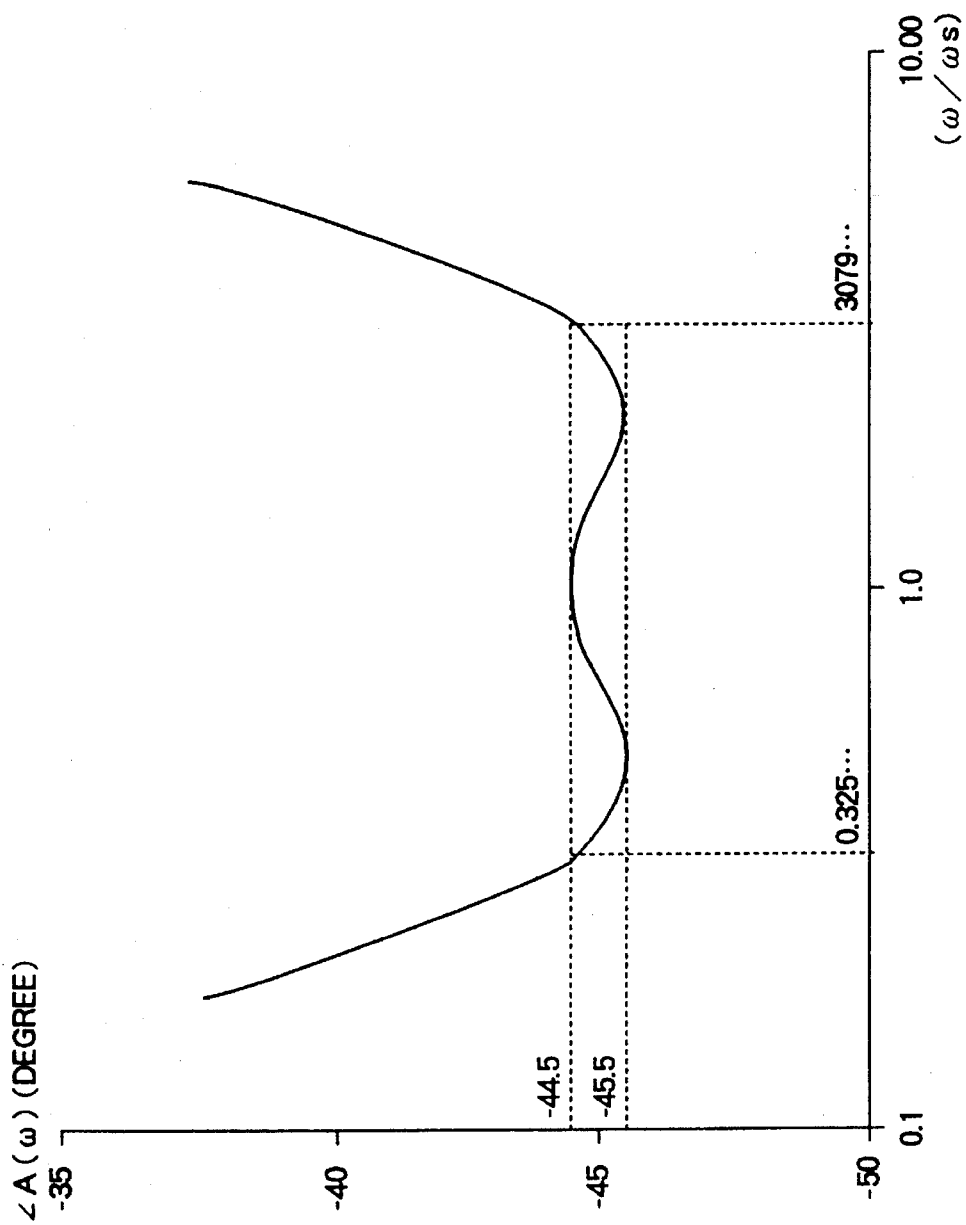
FIG. 12 is a graph showing the phase characteristic of the phase delay circuit 5 shown in FIG. 11.

If the constant "a" is set at 6.531 . . . and the constant "b" is set at 1.667 . . . , phase characteristic $\angle A(\omega)$ of the phase delay circuit 5 has a curve as shown in FIG. 12.

In detail, the phase delay is maintained at $-45\pm0.5°$ in a frequency range where the frequency ratio $\omega/\omega_S$ ranges from about 0.325 to about 3.079, i.e., in a frequency range in which signal frequency $\omega$ ranges from about $0.325\ \omega_S$ to about $3.079\ \omega_S$. Accordingly, a substantially constant phase delay can be obtained in a wide frequency range between $\omega_{min}$ and $\omega_{max}$ wherein ratio $\omega_{max}/\omega_{min}$ is as large as 9.47.

Figure 13:
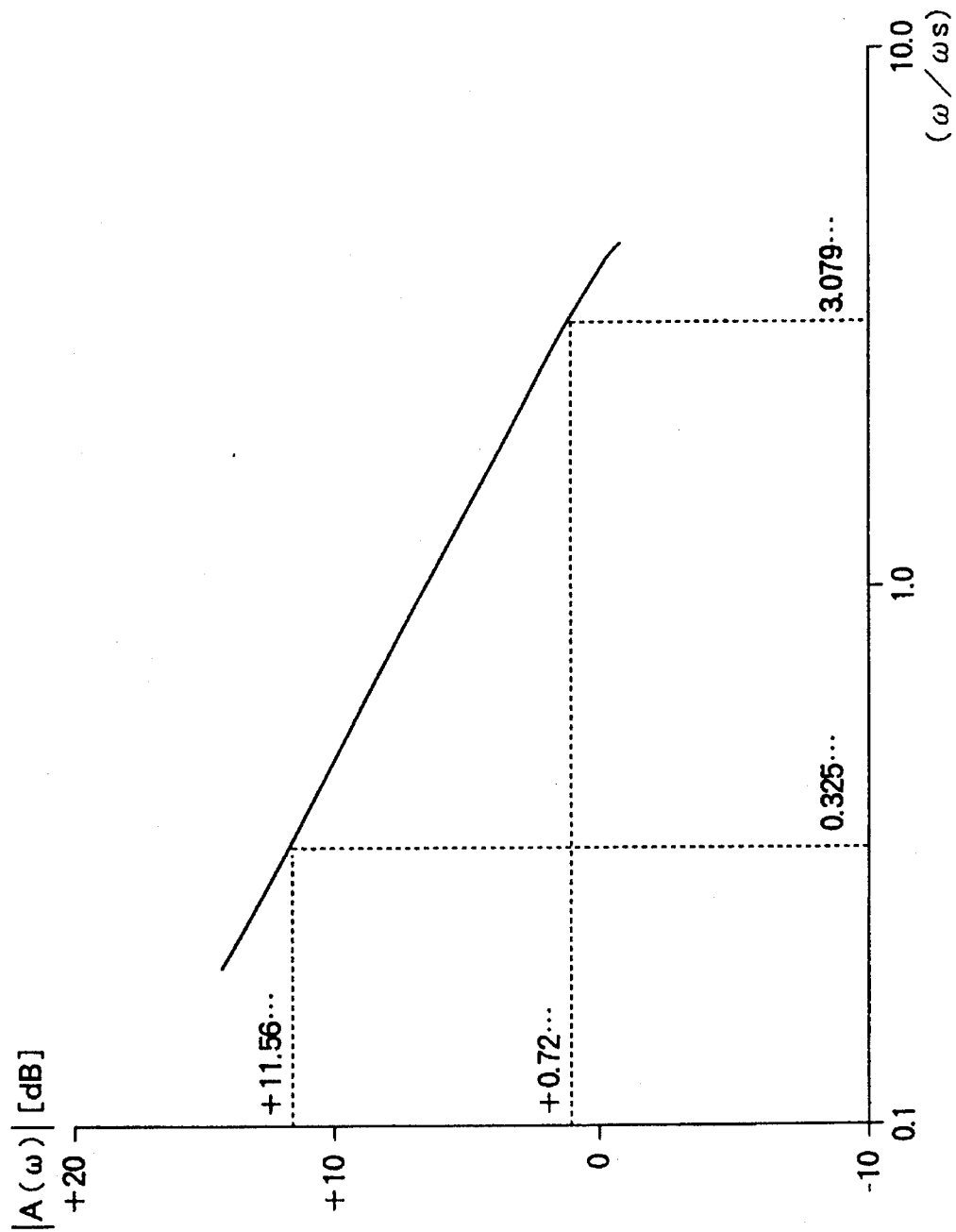
FIG. 13 is a graph showing the amplitude characteristic of the phase delay circuit 5 shown in FIG. 11.

Referring to FIG. 13, there is shown an amplitude characteristic of the phase delay circuit 5, wherein the gain $|A(\omega)|$ decreases from $+11.56$ dB to $+0.72$ dB with the increase of the frequency $\omega$ within the range of about $0.325\ \omega_S$ to about $3.079\ \omega_S$. In FIG. 13, the phase delay circuit 5 has a significant gain in the specified frequency range so that the output thereof is greater than the input thereof in amplitude.

Figure 1:
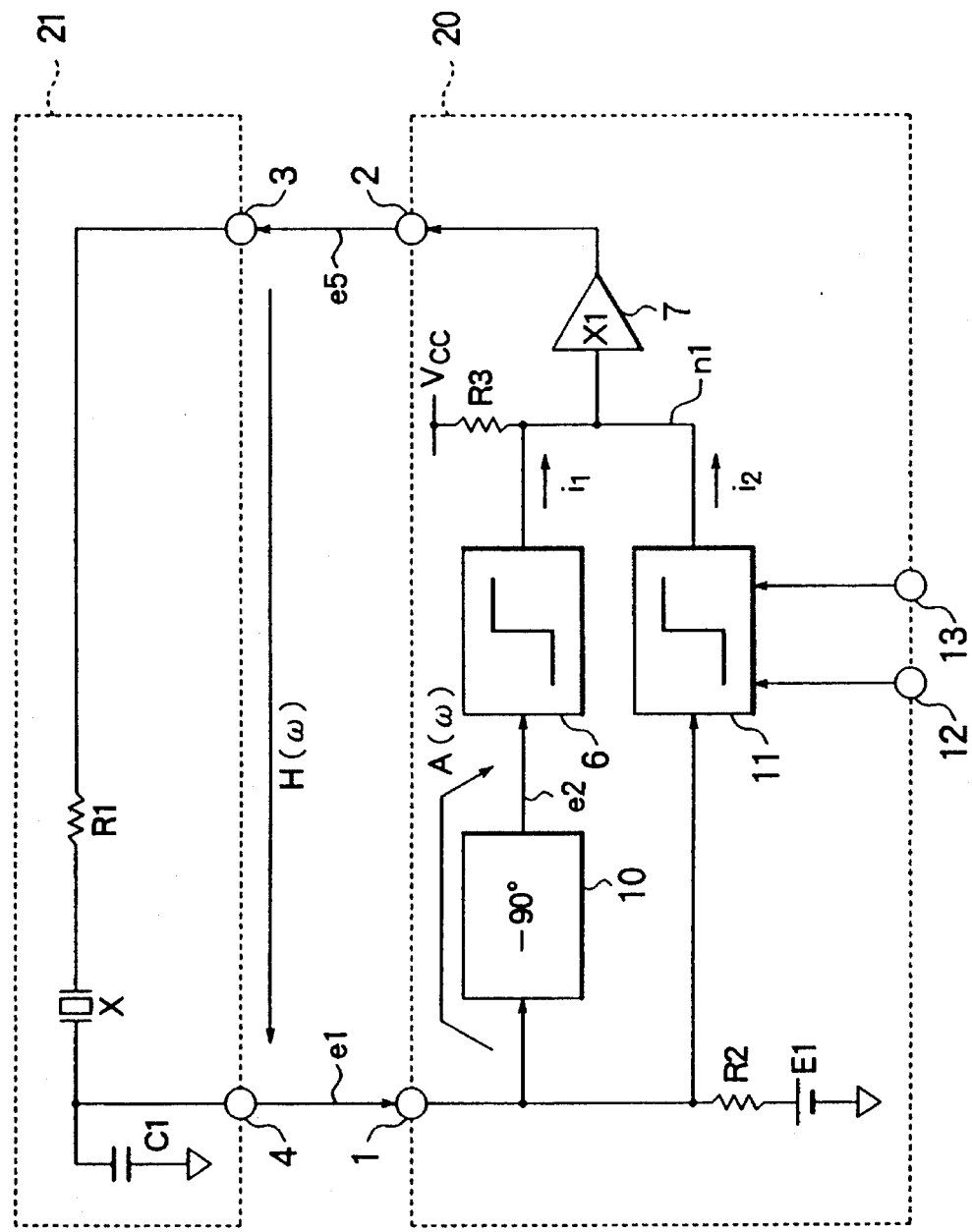
FIG. 1 is a block diagram of a conventional oscillation circuit.
Figure 2:
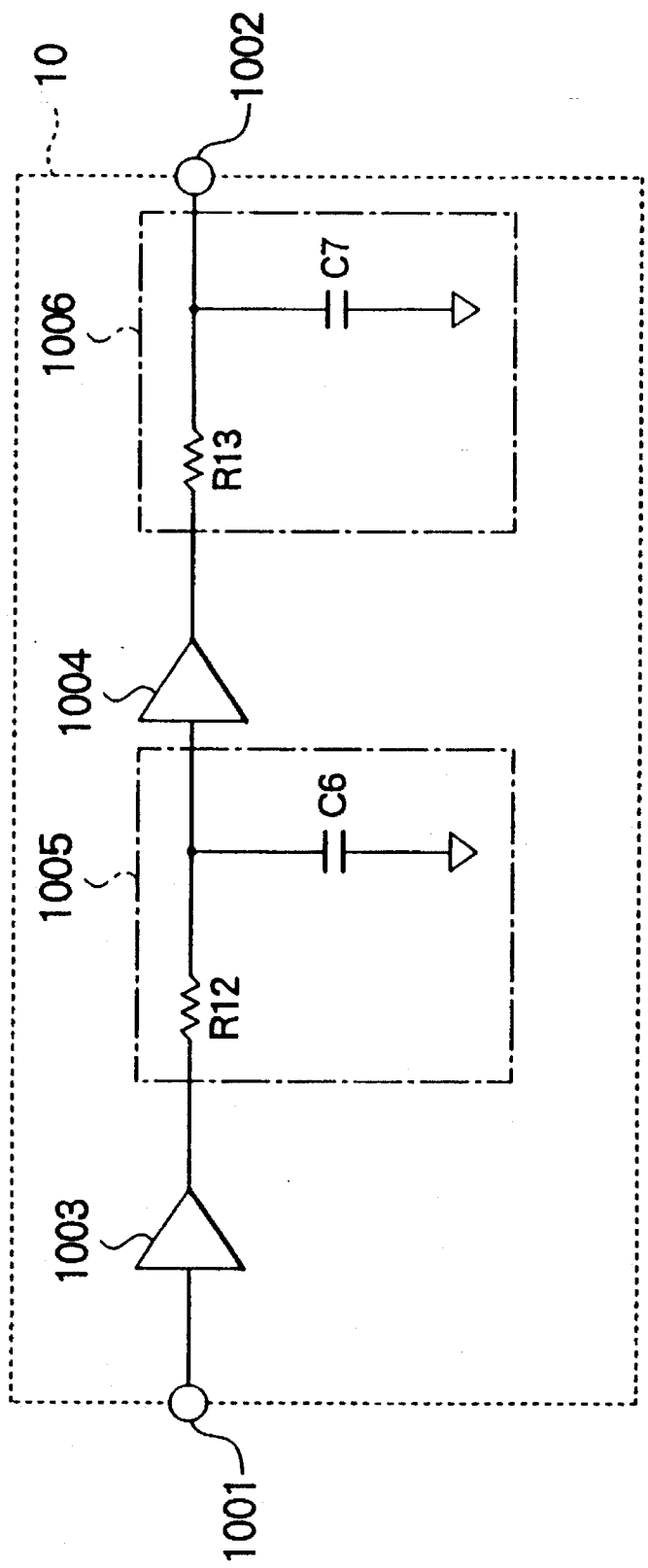
FIG. 2 is a circuit diagram of a phase delay circuit 10 shown in FIG. 1.
Figure 3:
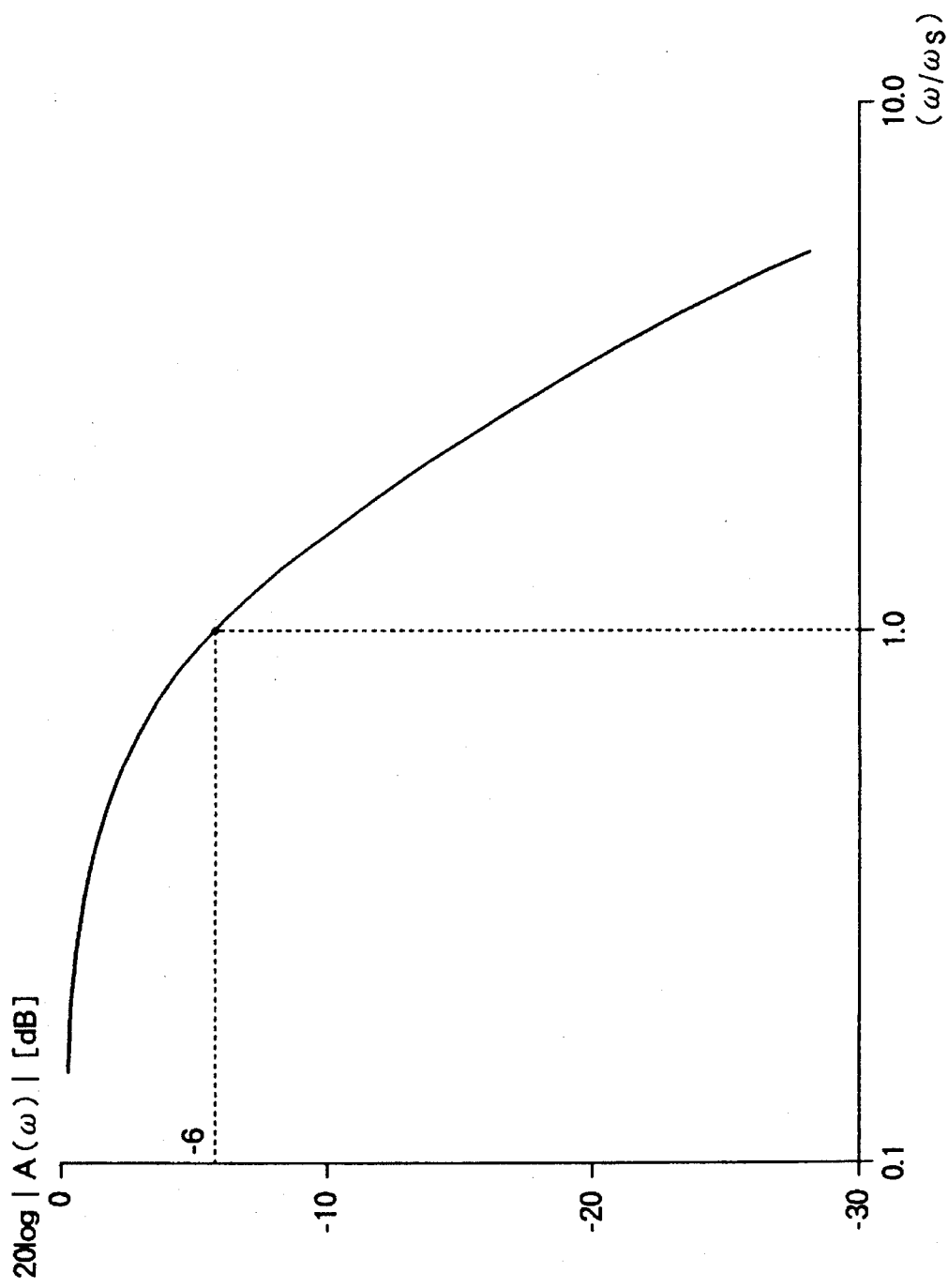
FIG. 3 is a graph showing the amplitude-frequency characteristic of the phase shift circuit shown in FIG. 1.
Figure 4:
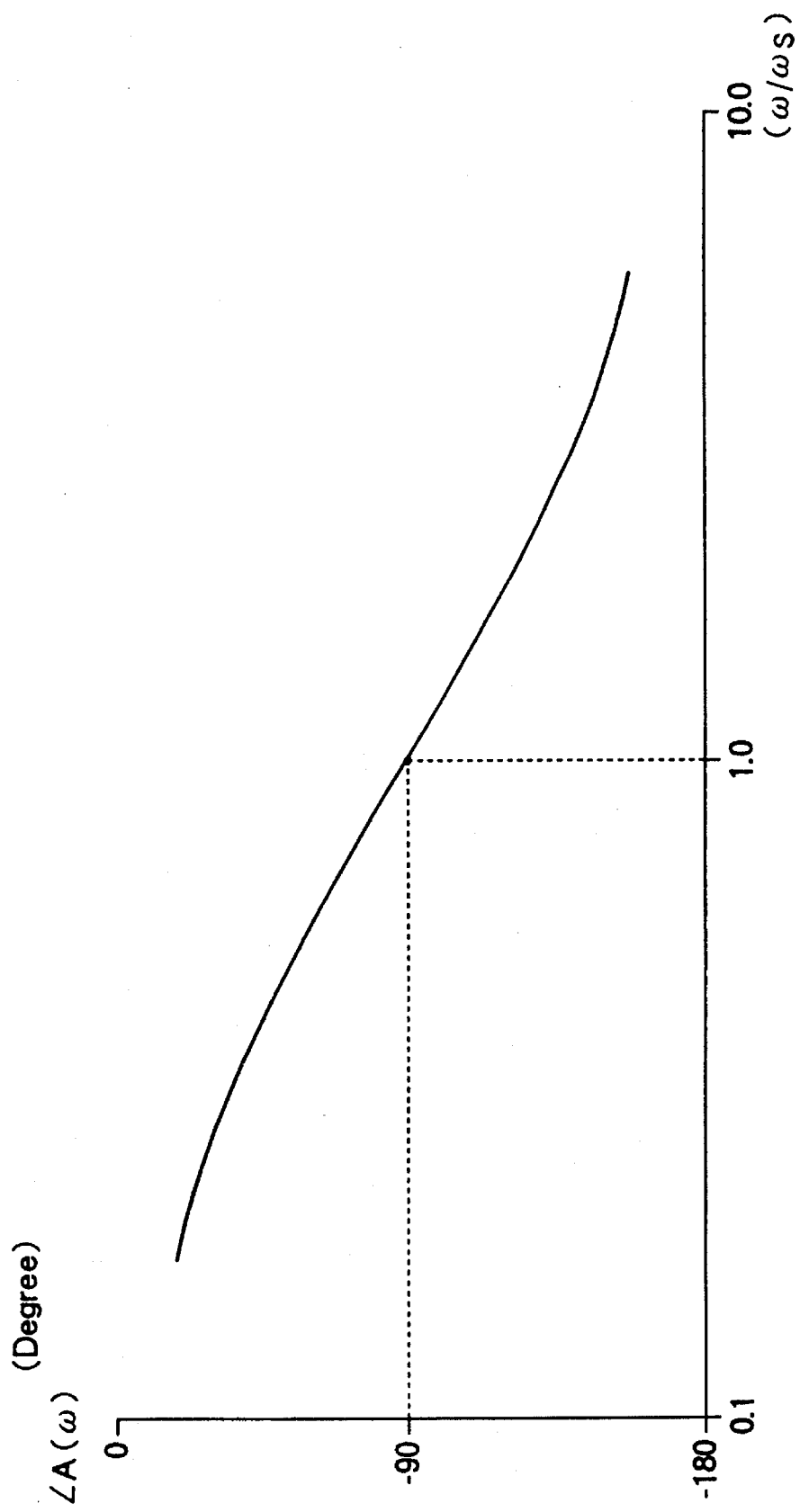
FIG. 4 is a graph showing the phase-frequency characteristic of the phase delay circuit 10 shown in FIG. 1.
Figure 5:
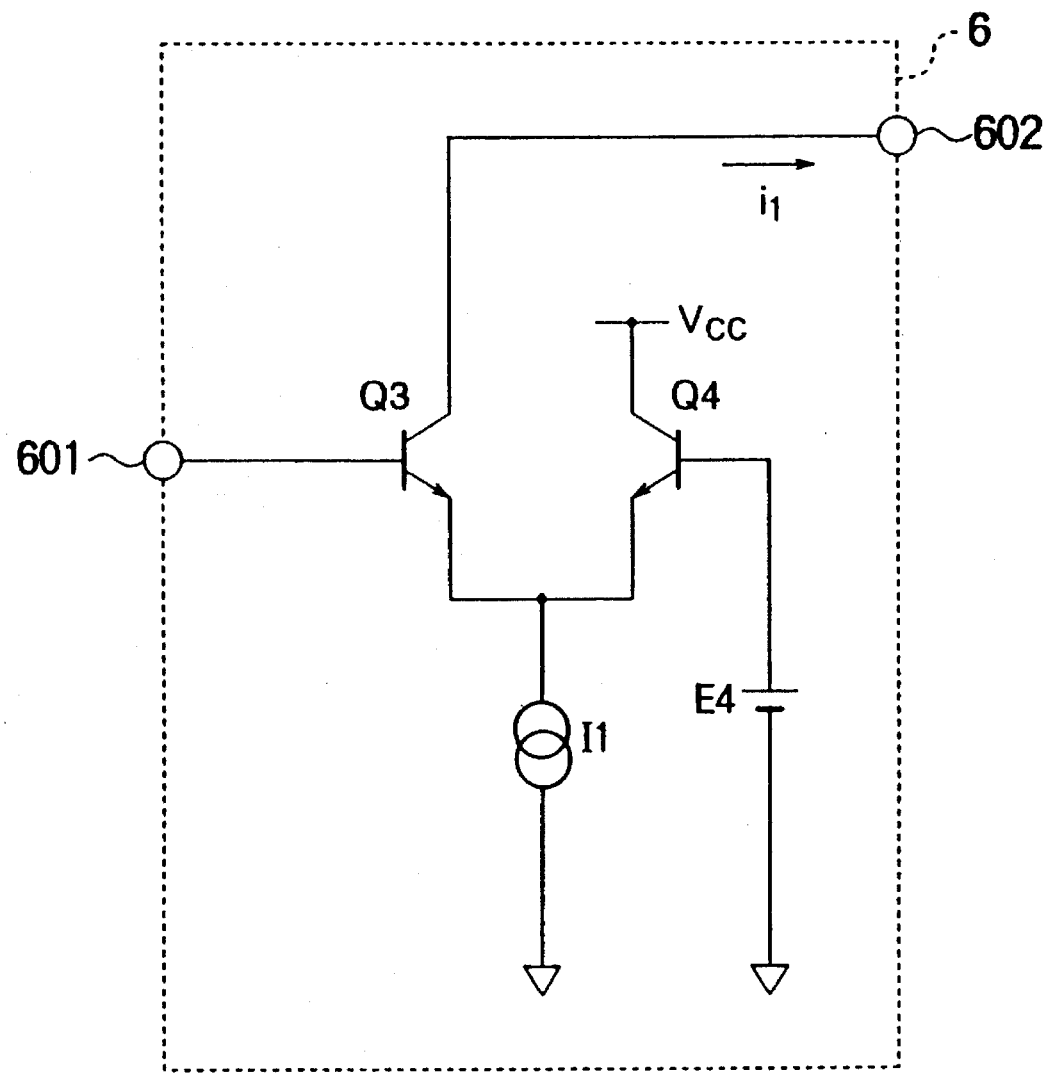
FIG. 5 is a circuit diagram of the first limiter circuit 6 shown in FIGS. 1 and 10.
Figure 6:
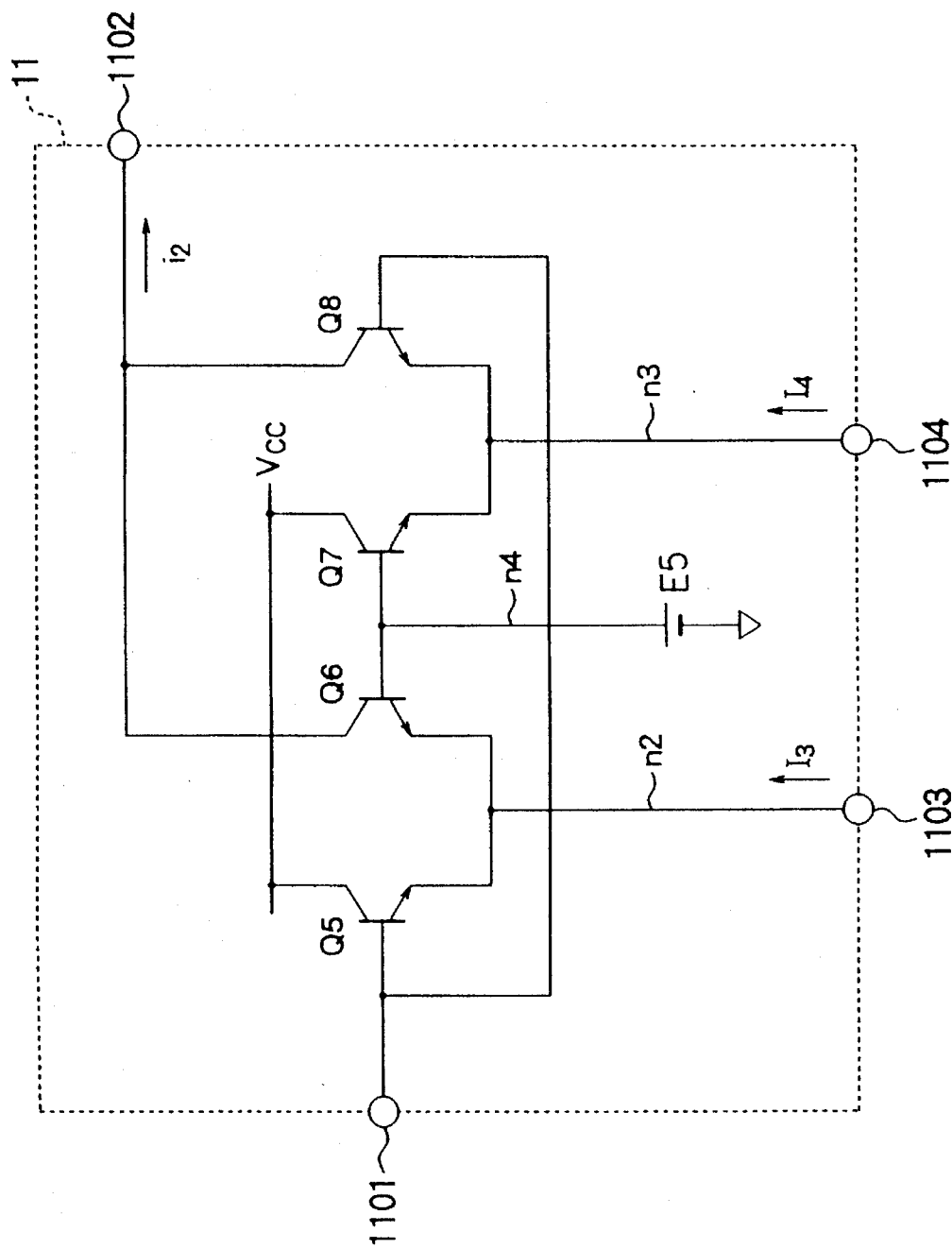
FIG. 6 is a circuit diagram of the second limiter circuit 11 shown in FIG. 1.

The first limiter circuit 6 has the same configuration as shown in FIG. 5, and receives second signal e2 from the phase delay circuit 5 through input terminal 601 to output a third signal composed of rectangular current pulses through output terminal 602. Similarly to the case of the conventional oscillation circuit shown in FIG. 1, the amplitude of the fundamental wave component i1 of the rectangular current signal e2 is $2 \cdot I1/\pi$ wherein I1 is a current supplied by constant current source I1, and the phase thereof is opposite to the phase of second signal e2. Accordingly, the phase of the fundamental wave component i1 of the rectangular current pulses output from the first limit circuit 6 leads by $+135°$ from the phase of first signal e1.

Figure 14:
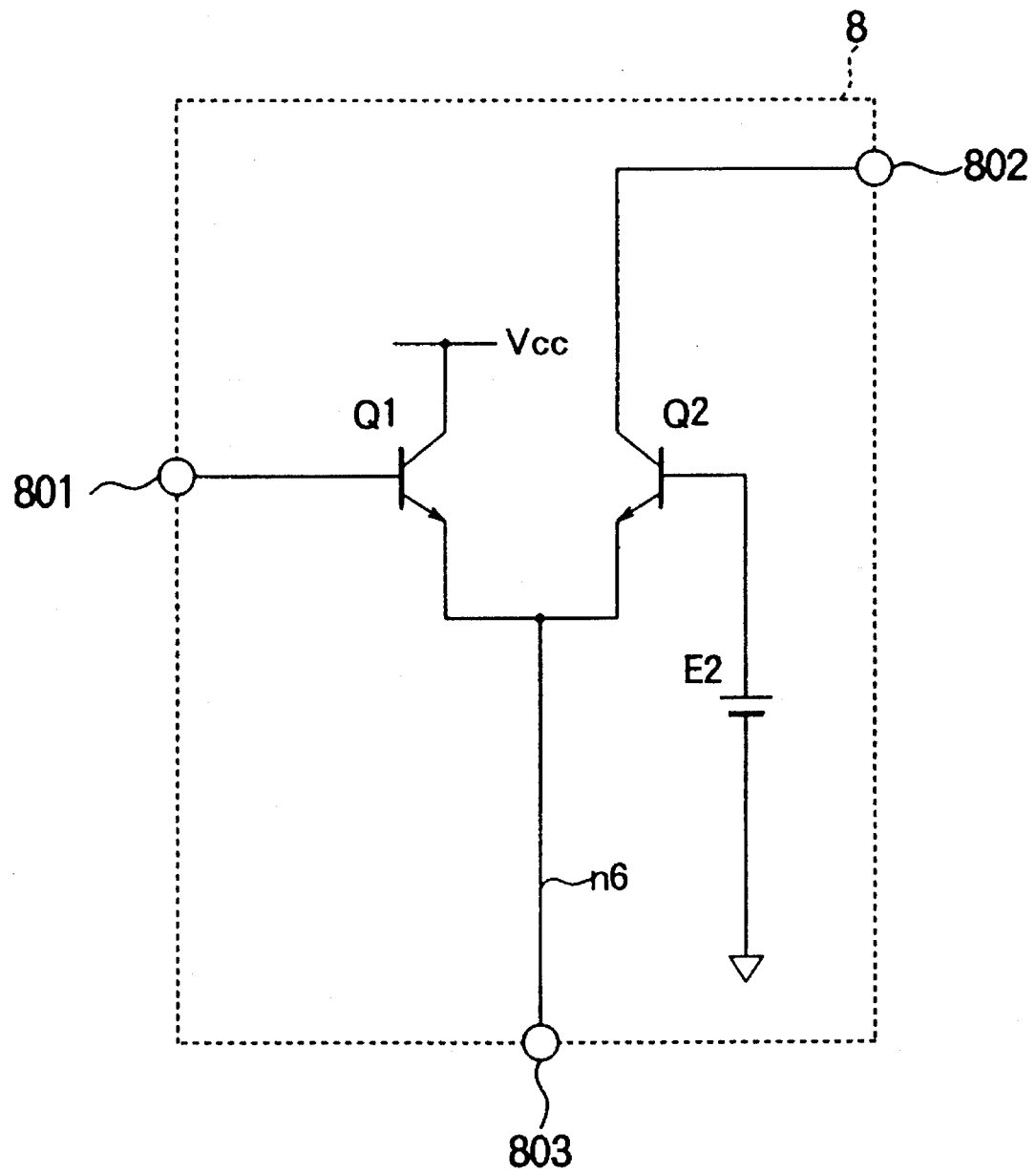
FIG. 14 is a circuit diagram of the second limiter circuit 8 shown in FIG. 10.

Referring to FIG. 14, the second limiter circuit 8 comprises transistors Q1 and Q2 to form a differential amplifier. The base of transistor Q1 is connected to input terminal 801 receiving the first signal while the collector thereof is connected to power supply line Vcc. The base of transistor Q2 is connected to the positive electrode of a voltage source E2, the negative electrode of which is grounded, while the collector of transistor Q2 is connected to output terminal 802. The emitters of transistors Q1 and Q2 are both connected to a control terminal 803 through a node n6. Since the voltage of the voltage source E2 is set equal to the voltage of the voltage source E1, the DC voltage E1 biasing first signal e1 is cancelled so that the differential circuit operates in accordance only with the first signal e1.

The amplitude of the first signal e1 is selected so that the differential circuit of FIG. 14 functions for a switching operation. Accordingly, the collector current of transistor Q2 outputs a fourth signal having a rectangular waveform, the amplitude of which is equal to that of the control signal supplied through control terminal 803, i.e., through control terminal 9 of FIG. 10. The amplitude of the fundamental wave component of the collector current of transistor Q2 can be expressed in terms of current I2 supplied to the control terminal 9 as $2 \cdot I2/\pi$. Current I2 can be expressed in terms of a parameter K as $I2 = 2^{1/2} \cdot K \cdot I1$ ($0<K<1$). Therefore, $2 \cdot I2/\pi$ can be expressed as $2 \cdot 2^{1/2} K \cdot I1/\pi$, which expresses the amplitude of the fundamental wave component i2 of the output current of the second limiter circuit 8 and is output through terminal 802. Here, the phase of the second fundamental current component i2 is in phase with first signal e1 input through terminal 801.

Figure 7:
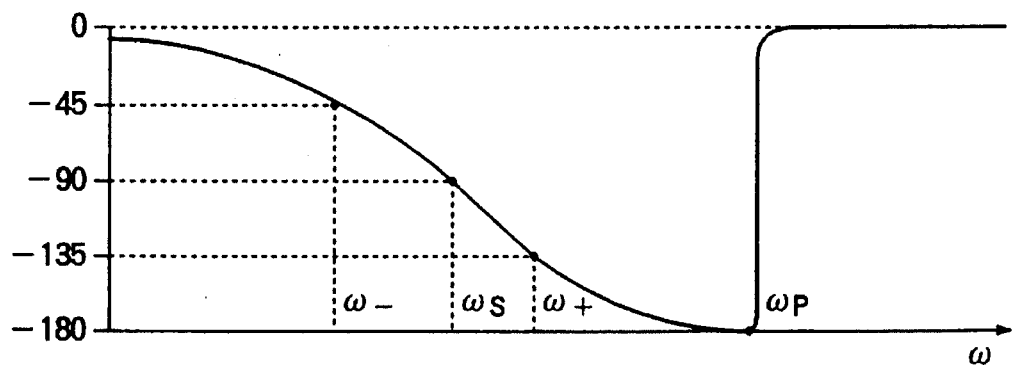
FIG. 7 is a graph showing the phase-frequency characteristic of the feedback circuit 21 shown in FIG. 1.
Figure 8:
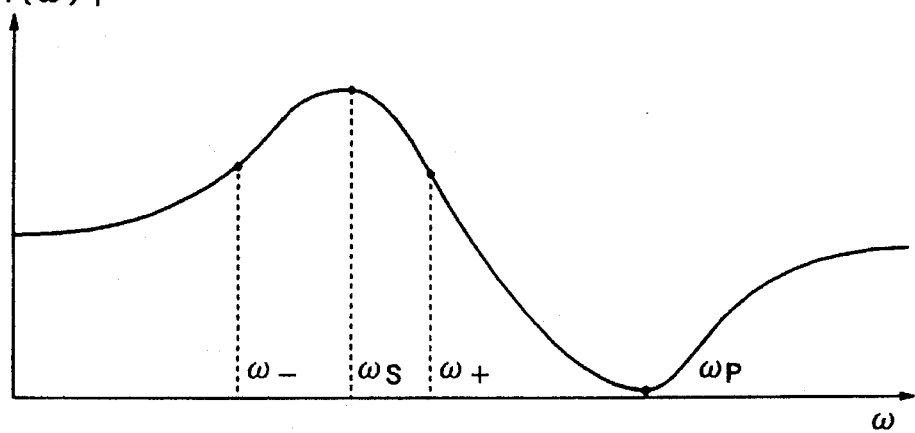
FIG. 8 is a graph showing the amplitude-frequency characteristic of the feedback circuit 21 shown in FIG. 1.
Figure 9:
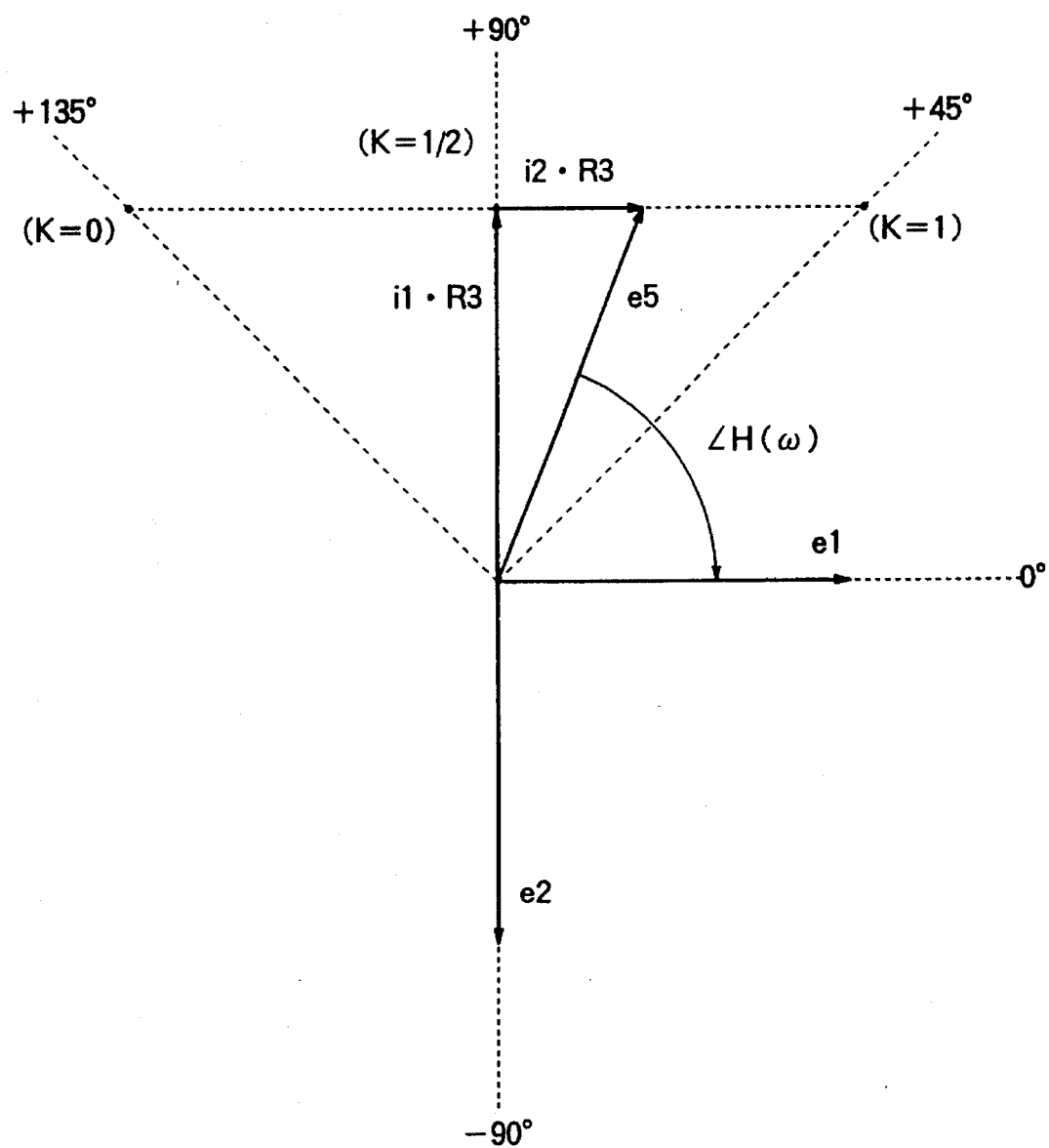
FIG. 9 is a chart showing the phase vectors of signals in the conventional oscillation circuit shown in FIG. 1.

The fundamental wave components i1 and i2 contained in the output currents from the first limiter circuit 6 and the second limiter circuit 8 are directly added together and converted to a voltage signal by a resistor R3. The voltage signal is output as a fifth signal e5 from output terminal 2 of the current-controlled phase shift circuit 20, via an output section 7. The fifth signal e5 is fed to an input terminal 3 of the feedback circuit 21. The feedback circuit has a transfer function $H(\omega)$ as described with reference to FIGS. 7 and 8 in connection with the conventional oscillation circuit. The fifth signal e5 is feedbacked through the feedback circuit 21 to the input terminal 1 of the current-controlled phase shift circuit 20 as the first signal e1, so as to form a positive feedback loop.

Figure 15:
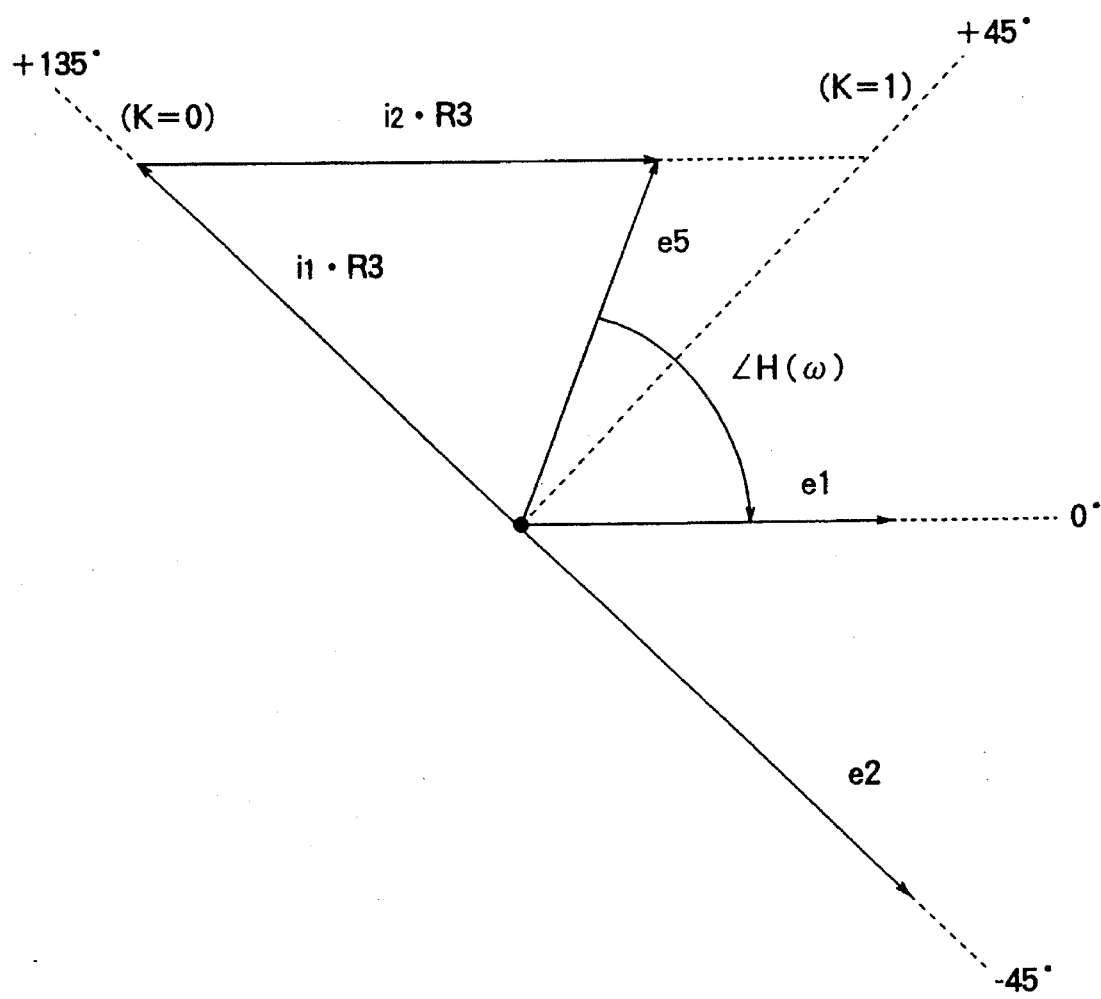
FIG. 15 is a chart showing the phase vectors of signals in the oscillation circuit shown in FIG. 10.

Referring to FIG. 15, there is shown a vector chart illustrative of the relationship among signals e1, e2, e5, i1·R3 and i2·R3 and the phase $\angle H(\omega)$ of the transfer function of the feedback circuit 21. When the parameter K is varied as desired, phase shift amount of the phase shift circuit 20 varies, so that it is possible to change the frequency at which the loop formed by the current-controlled phase shift circuit 20 and the feedback circuit 21 acts as a positive feedback loop, through varying the coefficient K by controlling the control current supplied through control terminal 9. Accordingly, similarly to the conventional oscillation circuit shown in FIG. 1, the oscillator circuit shown in FIG. 10 operates as an oscillation circuit in which the oscillation frequency can be controlled by the control current supplied through control terminal 9.

If the quartz resonator X in the feedback circuit 21 is replaced by a different one having a different natural frequency so that the series resonance frequency varies from $\omega_S$ to $\omega_S'$, the phase delay circuit 5 also maintains the phase delay of $-45\pm0.5°$ so long as $\omega_S'$ remains in the range between $0.325 \cdot \omega_S$ and $3.079 \cdot \omega_S$. Also, since the gain $20 \cdot \log|A(\omega)|$, is maintained above 0 dB, as shown in FIG. 13, the gain is sufficient to continue the oscillation. Moreover, variation range of the phase shift in fifth signal e5 is maintained within the range between about $+45°$ and $+135°$, as shown in FIG. 15, from the phase of first signal e1 of the current control phase shift circuit 20.

Accordingly, the oscillation circuit according to the present embodiment can oscillate at a selected frequency determined by a quartz resonator having series resonance frequencies ranging from $0.325 \cdot \omega_S$ to $3.079 \cdot \omega_S$ under the condition that the variability of the oscillation frequency is maintained. In the case where the current-controlled phase shift circuit 20 is implemented by a semiconductor integrated circuit, i.e. resistors R4, R5, R6 and R7, and capacitors C2 and C3 are formed in a semiconductor integrated circuit, the relative accuracy among the resistors and among the capacitors is sufficiently maintained. Consequently, variations in the absolute values of these elements have the same effect as that in the case where $\omega_S$ in equations (8), (9), (10) and (11) is changed, as is apparent from those equations. This effect can be regarded as the same as that of the case where the frequency $\omega$ is changed, i.e., the series resonance frequency $\omega_S$ of the quartz resonator in the feedback circuit 21 is altered because of a replacement of the quartz resonator X.

Moreover, since the frequency range between $\omega/\omega_S=\frac{1}{2}$ and $\omega/\omega_S=2$ is encompassed by the range between $\omega/\omega_S=0.325$ and $\omega/\omega_S=3.079$, the oscillation circuit of FIG. 10 can operate for oscillation, with the oscillation frequency being selected as desired, even when the absolute values of the resistors and capacitors in the phase delay circuit 5 are deviated from design value to some extent, similarly to the case where the quartz resonator is replaced as described above. In addition, since the phase characteristic of the phase delay circuit 5 is such that the phase shift thereof remains $-45\pm 0.5°$ in the frequency range between $\omega/\omega_S=\frac{1}{2}$ and $\omega/\omega_S=2$, the phase of the output e5 of the current-controlled phase shift circuit 20 remains constant for a specified control signal regardless of variations in the absolute values of the resistors and capacitors in the phase delay circuit 5.

Figure 16:
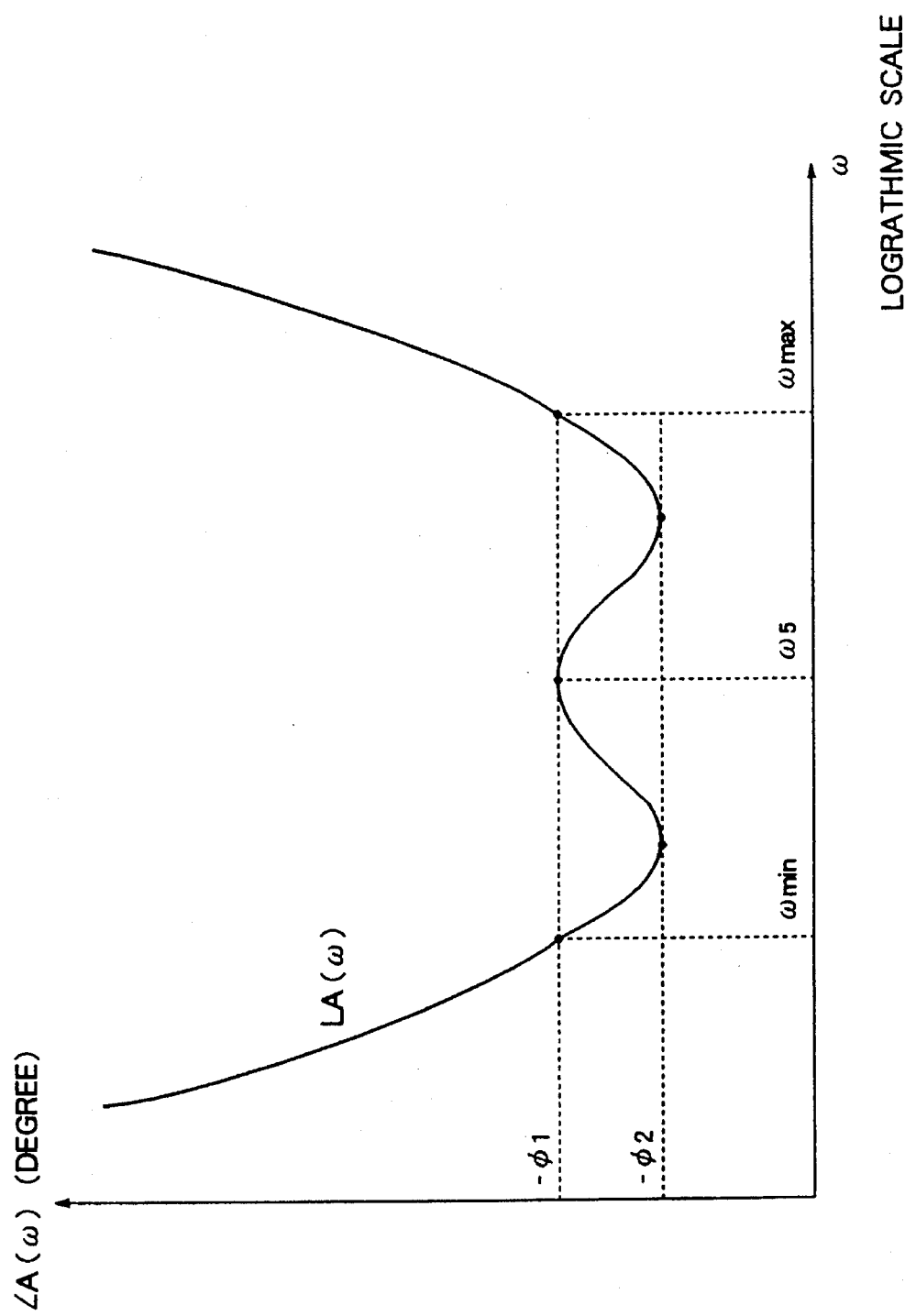
FIG. 16 is a graph showing the phase characteristic of the phase delay circuit 5 shown in FIG. 11.

In the embodiment as described above, the constants "a" and "b" in the transfer function $A(\omega)$ are selected at values 6.531 . . . and 1.667 . . . , respectively. However, the constants a and b ($a>b>1$) can be determined for continuous values of frequency $\omega$, according to FIG. 16 showing phase characteristic $\angle A(\omega)$ as a function of $\omega/\omega_S$, if the amount of the phase shift $-\phi_1$ and $-\phi_2$ ($\phi_2>\phi_1>0$) are determined.

A method for determining the constant a and b, and $\omega_{max}/\omega_{min}$ from the phase shift amount $\phi_2$ and $\phi_1$ will be described below.

First, the transfer function $A(\omega)$ is expressed in terms of the constants a and b ($a>b>1$) as follows:

$$A(\omega) = \frac{\left(1+j\frac{b\omega}{\omega_S}\right)\left(1+j\frac{\omega}{a\omega_S}\right)}{\left(1+j\frac{a\omega}{\omega_S}\right)\left(1+j\frac{\omega}{b\omega_S}\right)}. \tag{14}$$

From the equation (14), the following equation can be obtained:

$$\angle A(\omega) = -\tan^{-1}\frac{a\omega}{\omega_S} + \tan^{-1}\frac{b\omega}{\omega_S} - \tan^{-1}\frac{\omega}{b\omega_S} + \tan^{-1}\frac{\omega}{a\omega_S}. \tag{15}$$

Here, $\omega$ is expressed in terms of $\omega_S$ as follows:

$$\omega = x\cdot\omega_S. \tag{16}$$

Accordingly, the transfer functions $A(\omega)$ and the phase shift $\angle A(\omega)$ can be rewritten in terms of x as follows:

$$A(x) = \frac{(1+jbx)\left(1+j\frac{x}{a}\right)}{(1+jax)\left(1+j\frac{x}{b}\right)} \tag{17}$$

$$\angle A(x) = -\tan^{-1}ax + \tan^{-1}bx - \tan^{-1}\frac{x}{b} + \tan^{-1}\frac{x}{a} = \tag{18}$$

$$\tan^{-1}\left[-\frac{\left(a-\frac{1}{a}-b+\frac{1}{b}\right)x(1+x^2)}{1+\left\{\left(a-\frac{1}{a}\right)\left(b-\frac{1}{b}\right)+2\right\}x^2+x^4}\right] =$$

$$\tan^{-1}B(x).$$

Since $\tan^{-1}B(x)$ is a monotonously increasing function of $B(x)$, the increase and decrease of $\tan^{-1}B(x)$ coincide with the increase and decrease of $B(x)$. Accordingly, finding extremal values of $\angle A(\omega)$ is equivalent to finding extremal values of $B(x)$. The function $\angle A(\omega)$ has a maximal value $-\phi_1$ when $\omega$ is $\omega_S$ ($\omega>0$), and a minimal value $-\phi_2$ when $\omega$ assumes specified frequencies not equal to $\omega_S$. As to the nature of the function $B(x)$ in a range where x is greater than zero, the function $B(x)$ has a maximal value $\tan(-\phi_1)$ when x is 1, and a minimal value $\tan(-\phi_2)$ when x assumes one of two specified values not equal to 1.

Here, constants in $B(x)$ are to be simplified in terms of P and Q having values as follows:

$$P = \left(a-\frac{1}{a}\right)\left(b-\frac{1}{b}\right)+2 \tag{19}$$

$$Q = \left(a-\frac{1}{a}-b+\frac{1}{b}\right). \tag{20}$$

The function $B(x)$ can be rewritten accordingly as follows:

$$B(x) = -\frac{Qx(1+x^2)}{1+Px^2+x^4}. \tag{21}$$

For the case of $x=\lambda_1$ ($\lambda_1>1$), equation:

$$B(\lambda_1) = \tag{22}$$

$$-\frac{Q\lambda_1(1+\lambda_1^2)}{1+P\lambda_1^2+\lambda_1^4} = \frac{Q\frac{1}{\lambda_1}\left(1+\frac{1}{\lambda_1^2}\right)}{1+P\frac{1}{\lambda_1^2}+\frac{1}{\lambda_1^4}} = B\left(\frac{1}{\lambda_1}\right)$$

holds. Here, if $\lambda_1$ provides a minimal value of $B(x)$, $1/\lambda_1$ also provides the same minimum value. That is, if $1/\lambda_1$ does not provide a minimal value x, which is very close to $1/\lambda_1$ and which can make $B(x)$ smaller than $B(1/\lambda_1)$ can exist. This means that a value x which makes $B(x)$ close to $B(\lambda_1)$ but smaller than $B(\lambda_1)$ can exist in the vicinity of $\lambda_1$. This is against the assumption that $\lambda_1$ provides the minimal value $B(\lambda_1)$. Accordingly, if $\lambda_1$ provides the minimal value of $B(x)$, $1/\lambda_1$ also provides the same minimal value $B(\lambda_1)$.

Moreover, since $B(x)$ is an odd function, $-\lambda_1$ provides a maximal value which is equal to $-B(\lambda_1)$, taking account of the fact that $\lambda_1$ ($\lambda_1>0$) provides a minimal value of $B(x)$. If $-\lambda_1$ does not provide a maximal value, a value x which is very close to $-\lambda_1$ and which can make $B(x)$ larger than $B(-\lambda_1)$ can exist. This means that a value x which makes $B(x)$ smaller than $B(\lambda_1)$ can exist in the vicinity of $\lambda_1$. This is against the assumption that $\lambda_1$ provides the minimal value $B(\lambda_1)$. Accordingly, when $\lambda_1$ ($\lambda_1>1$) provides $B(x)$ with a minimal value $B(\lambda_1)=\tan(-\phi2)$, $B(x)$ also gives a minimal value $B(1/\lambda_1)=\tan(-\phi2)$. Further, $B(x)$ has a maximal value $B(-\lambda_1)=B(-1/\lambda_1)=-\tan(-\phi2)$.

It will be readily understood accordingly that the function $\angle A(\omega)$ shows a curve as shown in FIG. 16, by examining that $B(x)$ gives a maximal value when x is 1, and a minimal value when x is $\lambda_1$ ($\lambda_1>1$).

$B(x)$ is then differentiated and is rearranged to obtain the following equation:

$$\frac{dB(x)}{dx} = Q\cdot\frac{(x^2-1)\{x^4+(4-P)x^2+1\}}{x^4+Px^2+1} \tag{23}$$

$P>0$ and $Q>0$ can be confirmed by applying the relationship $a>b>1$ to equations (19) and (20). Hence, the inequality $x^4+Px^2+1>0$ holds. Accordingly, values for x which provide a maximal value and a minimal value of $B(x)$ can be determined from the roots of equation:

$$(x^2-1)\{x^4+(4-P)x^2+1\}=0$$

and the sign of:

$$(x^2-1)\{x^4+(4-P)x^2+1\}.$$

Since the roots of the equation $(x^2-1)\{x^4+(4-P)x^2+1\}=0$ apparently includes $x=\pm 1$, $B(x)$ provides extremal values when x is $+1$ or $-1$. If $B(x)$ has a minimal value when $x=\lambda_1$ ($\lambda_1>1$), the value $\lambda_1$ is also a root of the equation $x^4+(4-P)x^2+1=0$. Moreover, in the case where $B(x)$ has a minimal value when $x=\lambda_1$, $B(x)$ also has a minimal value when $x=1/\lambda_1$. Further, $B(x)$ has a maximal value when $x=-1/\lambda_1$ and $x=-\lambda_1$. Accordingly, $\pm 1/\lambda_1$ and $\pm\lambda_1$ are roots of the equation $x^4+(4-P)x^2+1=0$, so that the left-hand side of the equation $X^4+(4-P)x^2+1=0$ can be expressed as a product of $x+1/\lambda_1$, $x-1/\lambda_1$, $x+\lambda 1$, and $x-\lambda_1$ as follows:

$$x^4 + (4-P)x^2 + 1 = \tag{24}$$

$$\left(x+\frac{1}{\lambda_1}\right)\left(x-\frac{1}{\lambda_1}\right)(x+\lambda_1)(x-\lambda_1) =$$

$$x^4 - \left(\lambda_1^2 + \frac{1}{\lambda_1^2}\right)x^2 + 1.$$

Comparing the coefficients of $x^2$, the equation $4-P=-(\lambda_1^2+1/\lambda_1^2)$ can be obtained. When the inequality (arithmetical mean)>(geometrical mean) is applied, the following inequality can be obtained, wherein $\lambda_1 \neq 1$:

$$P = 4 + \left(\lambda_1^2 + \frac{1}{\lambda_1^2}\right) > 4 + 2\sqrt{\lambda_1^2 \cdot 1/\lambda_1^2} = 6. \tag{25}$$

From the equation (19) and inequality (25), the following inequality can be obtained:

$$\left(a-\frac{1}{a}\right)\left(b-\frac{1}{b}\right) > 4. \tag{26}$$

From the inequality (26), it is found that $B(x)$ gives extremal values thereof when $x$ is $+1/\lambda_1$, $+1$, and $+\lambda_1$ ($\lambda_1>0$). When $x$ is positive, the sign of $dB(x)/dx$ is negative in the range $0<x<1/\lambda_1$, positive in the range $1/\lambda_1<x<1$, negative in the range $1<x<\lambda_1$, and positive in the range $\lambda_1<x$. Accordingly, $B(x)$ gives a maximal value $\tan(-\phi_1)$ when $x$ is 1, and a minimal value $\tan(-\phi_2)$ when $x$ is $\lambda_1$ and $1/\lambda_1$. In the range $0<x<1/\lambda_1$, $B(x)$ is a monotonously decreasing function of $x$, so that there is one specific value for $x$ which satisfies the equation $B(x)=\tan(-\phi_1)$. In the range $\lambda_1<x$, $B(x)$ is a monotonously increasing function of $x$, and $$\lim_{x\to\infty} B(x) = 0.$$

Figure 17:
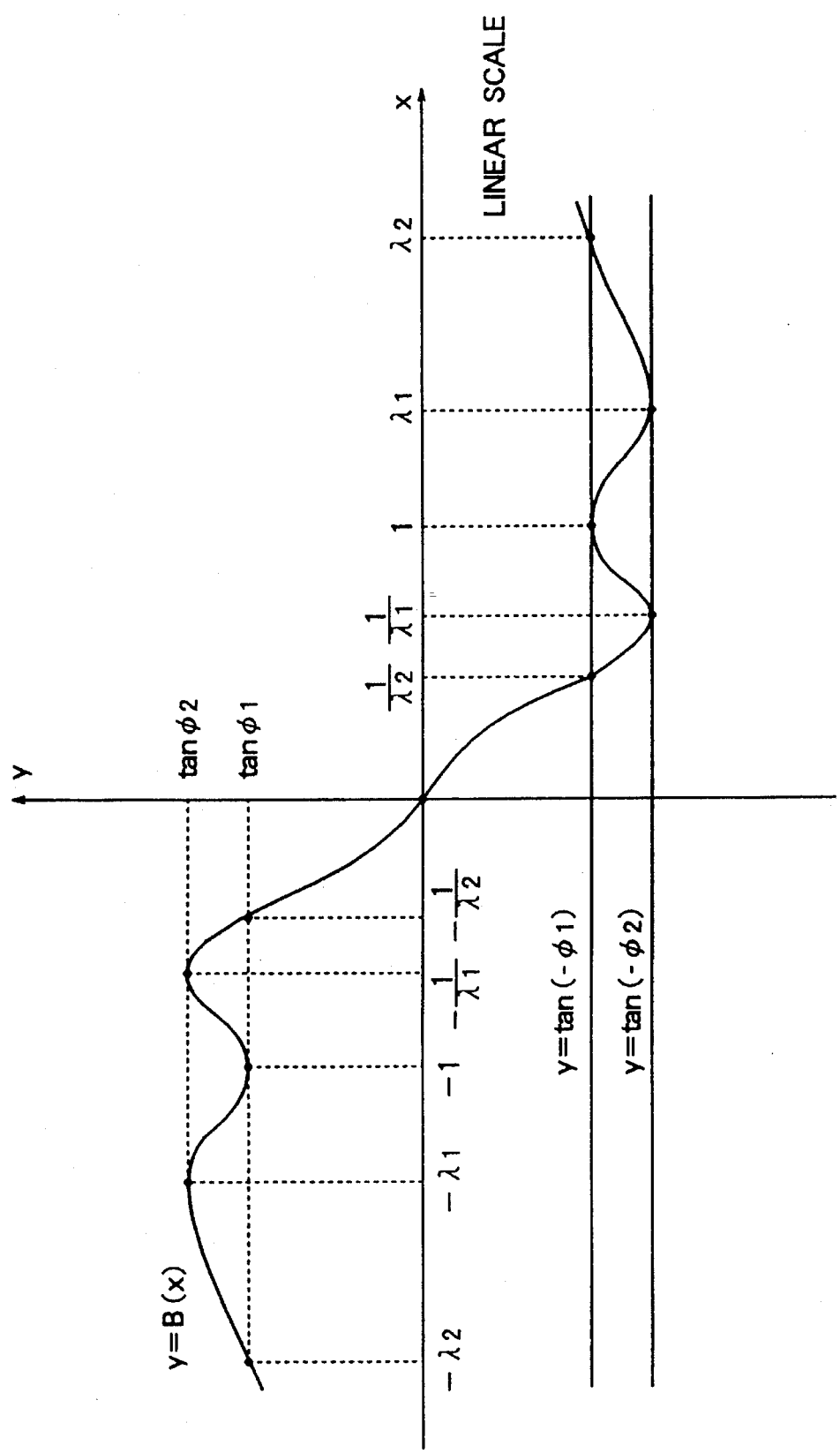
FIG. 17 is a graph showing a function y=B(x)

Accordingly, there is a specific value for $x$ which satisfies the relationship $B(x)=\tan(-\phi_1)$. In the case where $\lambda_2$ ($\lambda_1<\lambda_2$) causes $B(x)$ to have a value $\tan(-\phi_1)$, $B(x)$ has the value $\tan(-\phi_1)$ also when $x$ is $1/\lambda_2$ ($0<1/\lambda_2<1/\lambda_1$). Since $B(x)$ monotonously increases and decreases in the ranges $1/\lambda_1<x<1$ and $1<x<\lambda_1$, respectively, and the inequality $\tan(-\phi_2)<B(x)<\tan(-\phi_1)$ holds in those ranges, there are no specific values for $x$ which makes $B(x)$ equal to $\tan(-\phi_1)$ or $\tan(-\phi_2)$. Considering the above and that $B(x)$ is an odd function, a curve for function $y=B(x)$ is obtained as shown in FIG. 17. When variation of $B(x)$ for the case of $x>0$ is converted to variation of $\angle A(\omega)$ by using equations (16) and (18), the variation of $\angle A(\omega)$ shown in FIG. 16 can be obtained, in which $\angle A(\omega)$ has a maximal value $-\phi_1$ when $\omega=\omega_5$, and has a minimal value $-\phi_2$ when $\omega=(1/\lambda_1)\cdot\omega_5$ or $\omega=\lambda_1\cdot\omega_5$, and the inequality $-\phi_2<\angle A(\omega)<-\phi_1$ holds in the range between $\omega_{min}=(1/\lambda_2)\cdot\omega_5$ and $\lambda_{max}=\lambda_2\cdot\omega_5$, wherein $\omega_{wmin}$ and '$_{max}$ are determined by $\lambda_2$ ($\lambda_2>\lambda_1>1$).

From the above-described analysis, it has been found, through expressing the transfer function $A(\omega)$ by equation (14), that $\angle A(\omega)$ varies in accordance with the variation of $\omega$ as shown in FIG. 16. The remaining task is therefore to find the way for expressing the constants a and b in terms of $\phi_1$ and $\phi_2$ in $A(\omega)$.

As described before, variation of $A(\omega)$ can be investigated by investigating variation of $B(x)$, so that the constants a and b can be obtained by utilizing the intersections (including contact points) of $y=B(x)$ with $y=\tan(-\phi_1)$ and $y=\tan(-\phi_2)$, and the parameters P and Q included in $B(x)$.

Values for $x$ at the intersections between $B(x)$ and $y=\tan(-\phi_1)$ are the roots of equation:

$$B(x)=\tan(-\phi_1). \tag{27}$$

From equation (21), equation (27) can be rewritten to the following biquadratic equation:

$$x^4 - Q\cdot\cot\phi_1\cdot x^3 + Px^2 - Q\cdot\cot\phi_1\cdot x + 1 = 0. \tag{28}$$

As shown in FIG. 17, the roots of the equation (27) are $x=1$, $x=1/\lambda_2$, and $x=\lambda_2$, wherein $\lambda_2>1$. Root $x=1$ is at least a double root, because $y=B(x)$ contacts $y=\tan(-\phi_1)$ when $x=1$. Since the roots of equation (28) obtained by modifying equation (27) are $x=1/\lambda_2$ and $x=\lambda_2$, equation (28) can be decomposed as a product of $(x-1)^2$, $x-1/\lambda_2$, and $x-\lambda 2$.

$$x^4 - Q\cot\phi_1 \cdot x^3 + Px^2 - Q\cot\phi_1 \cdot x + 1 = \tag{29}$$

$$(x-1)^2\left(x-\frac{1}{\lambda_2}\right)(x-\lambda_2).$$

The right-hand side of equation (29) is expanded and compared with the left-hand side, so that the following equations can be obtained from the coefficients of $x^3$, $x$, and $x^2$.

$$P = 2 + z\left(\lambda_2 + \frac{1}{\lambda_2}\right) \tag{30}$$

$$Q\cot\phi_1 = 2 + \left(\lambda_2 + \frac{1}{\lambda_2}\right). \tag{31}$$

Similarly, values for $x$ at the contact points between $y=B(x)$ and $y=\tan(-\phi_2)$ are the roots for the equation:

$$B(x)=\tan(-\phi_2). \tag{32}$$

From equation (21), equation (32) can be rewritten to the following biquadratic equation:

$$x^4 - Q\cot\phi_2\cdot x^3 + Px^2 - Q\cot\phi_2\cdot x + 1 = 0. \tag{33}$$

As shown in FIG. 17, the roots of equation (33) are $x=1/\lambda_1$ and $x=\lambda_1$, wherein $\lambda_1>0$. Since $y=B(x)$ contacts with $y=\tan(-\phi_2)$ when $x=1/\lambda_1$ or $x=\lambda_1$, these roots are double roots. Accordingly, equation (33) can be decomposed to a product of $(x-1/\lambda_1)^2$ and $(x-\lambda_1)^2$. Hence, equation:

$$x^4 - Q\cot\phi_2 x^3 + Px^2 - Q\cot\phi_2 x + 1 = \left(x-\frac{1}{\lambda_1}\right)^2(x-\lambda_1)^2 \tag{34}$$

can be obtained. When the right-hand side of equation (34) is expanded and compared with the left-hand side, the following equations can be obtained from the coefficients of $x^3$, $x$, and $x^2$:

$$P = \left(\lambda_1 + \frac{1}{\lambda_1}\right)^2 + 2 \tag{35}$$

$$\frac{Q}{2}\cot\phi_2 = \lambda_1 + \frac{1}{\lambda_1}. \tag{36}$$

By eliminating $\lambda_2$ from equations (30) and (31), and $\lambda_1$ from equations (35) and (36), the following equations are obtained:

$$P - 2Q\cot\phi_1 = -2 \tag{37}$$

$$P = (Q^2/4)\cot^2\phi_2 + 2. \tag{38}$$

To simplify the calculation, the following constants c and d are introduced:

$$c = a - \frac{1}{a} \quad (39)$$

$$d = b - \frac{1}{b} . \quad (40)$$

From equations (39) and (40), P and Q defined by equations (19) and (20) can be expressed as P=cd+2 and Q=c−d, respectively. By substituting these for equations (37) and (38), the following equations are obtained:

$$cd = \frac{(c-d)^2}{4} \cot^2\phi_2 \quad (41)$$

$$cd + 4 = 2(c-d)\cot\phi_2. \quad (42)$$

For equation (41), inequality c>d>0 holds, because c=a−1/a, d=b−1/b, and a>b>1. Taking the ratio of c to d into consideration, c can be expressed in terms of a coefficient z (z>1) as follows:

$$c = dz. \quad (43)$$

By substituting equation (43) for equation (41), dividing both sides by $d^2$ and rearranging, the following quadratic equation of z can be obtained:

$$z^2(2+4\tan^2\phi_2)z+1=0. \quad (44)$$

Equation (44) is solved to obtain root for z as follows;

$$z = 1 + 2\tan^2\phi_2 + 2\sqrt{\tan^2\phi_2 + \tan^4\phi_2} . \quad (45)$$

By substituting equation (43) for equation (42), the following equation can be obtained:

$$zd^2 - 2(z-1)\cot\phi_1 d + 4 = 0. \quad (46)$$

Equation (46) is then solved for d, and an expression for c is also obtained from the same and equation (43), as follows:

$$c = \frac{(z-1) \pm \sqrt{(z-1)^2 - 4z\tan^2\phi_1}}{\tan\phi_1} \quad (47)$$

$$d = \frac{(z-1) \pm \sqrt{(z-1)^2 - 4z\tan^2\phi_1}}{z\tan\phi_1} . \quad (48)$$

Double signs included in the above equations for c and d can be determined as described below.

When expression (26) is rewritten in terms of c and d, the following expression is obtained:

$$cd > 4. \quad (49)$$

After multiplying both sides by z, the expression is modified by using the relationship c=dz and by taking square roots of both sides, leading to the following expression:

$$c > 2\sqrt{z} . \quad (50)$$

Since inequality (50) holds when $\phi_2 > \phi_1$, inequality (50) must hold when $\phi_1 = 45°$ and $\phi \to 90°$. It is understood from expression (45) that the function for z is a monotonously increasing function of $\tan\phi_2$ and z approaches infinity when $\phi_2 \to 90°$.

Here, if the double sign in equation (47) is negative, c can be expressed as follows:

$$c = (z-1) - \sqrt{(z-1)^2 - 4z} .$$

Accordingly, the extremal value of the reciprocal of the above equation is as follows when $\phi_2 \to 90°$:

$$\frac{1}{c} = \frac{1}{(z-1) - \sqrt{(z-1)^2 - 4z}}$$

$$= \frac{(z-1) + \sqrt{(z-1)^2 - 4z}}{(z-1)^2 - \{(z-1)^2 - 4z\}}$$

$$= \frac{(z-1) + \sqrt{(z-1)^2 - 4z}}{4z}$$

$$= \frac{1}{4} - \frac{1}{4z} + \sqrt{(1/16) - (3/8z) + (1/16z^2)}$$

$$\to 1/2 \ (z \to \infty).$$

Accordingly, c→2 if z→∞. In the right-hand side of inequality (50), however. $2\sqrt{z} \to \infty$ if z→∞, so that the above equation is not compatible with inequality (50). Therefore, the double sign included in equation (47) for c must be positive.

From equation (43), d=c/z, so that c and d can be expressed as follows:

$$c = \frac{(z-1) + \sqrt{(z-1)^2 - 4z}}{\tan\phi_1} \quad (51)$$

$$d = \frac{(z-1) + \sqrt{(z-1)^2 - 4z}}{z \times \tan\phi_1} . \quad (52)$$

From c=a−1/a, the following quadratic equation of "a" can be obtained by multiplying both sides of equation (51) by "a" and rearranging them:

$$a^2 - ca - 1 = 0. \quad (53)$$

By solving equation (53) for "a", "a" can be obtained as follows (note a>1):

$$a = \frac{c + \sqrt{c^2 + 4}}{2} . \quad (54)$$

From expression d=b−1/b, the following quadratic equation of "b" can be obtained by multiplying both sides of equation (52) by "b" and rearranging them:

$$b^2 - db - 1 = 0. \quad (55)$$

By solving equation (55) for "b", "b" can be obtained as follows (note: b>1):

$$b = \frac{d + \sqrt{d^2 + 4}}{2} . \quad (56)$$

As described above, "z" is obtained in terms of $\phi_2$ from equation (45), "c" and "d" are obtained in terms of $\phi_1$ and "z" from equations (51) and (52), "a" is obtained in terms of "c" from equation (54), and "b" is obtained in terms of "d" from equation (56). Accordingly, it has been found that the constants "a" and "b" included in the function $\angle A(\omega)$ are determined by $\phi_1$ and $\phi_2$ ($\phi_2 > \phi_1$).

In a specific case where $\phi_1 = 44.5°$ and $\phi_2 = 45.5°$, "z" is obtained as 5.9747 . . . so that "a" and "b" are determined at 6.531 . . . , and 1.667 . . . , respectively. From these constants "a" and "b", function A(ω) can be obtained if $\omega_S$ is determined. In FIG. 12, the phase characteristic of the phase shift circuit 5 of FIG. 11 is illustrated in terms of the parameter $\omega/\omega_S$.

Now, the ratio $\omega_{max}/\omega_{min}$ is to be obtained in terms of $\phi_1$ and $\phi_2$. Since $\omega_{min}$ and $\omega_{max}$ shown in FIG. 16 can be expressed as $\omega_{min}=(1/\lambda_2)W_S$ and $\omega_{max}=\lambda_2\omega_S$ in terms of $1/\lambda_2$ and $\lambda_2$ shown in FIG. 17, it is sufficient to show that the relationship $\omega_{max}/\omega_{min}=\lambda_2^2$ can be expressed in terms of $\phi_1$ and $\phi_2$. Firstly, the following equation is obtained by eliminating P from equations (37) and (38):

$$2Q\cot\phi_1 = \frac{Q^2}{4}\cot^2\phi_2 + 4. \tag{57}$$

By replacing $Q\cot\phi_1$ by U for equation (57) and rearranging the same, a quadratic equation for U can be obtained as follows:

$$U^2 - 8\cdot\frac{\tan^2\phi_2}{\tan^2\phi_1}\cdot U + 16\cdot\frac{\tan^2\phi_2}{\tan^2\phi_1} = 0. \tag{58}$$

Subsequently, by replacing $\phi_1$ and $\phi_2$ by a parameter T according to the following equation:

$$T = \frac{\tan^2\phi_2}{\tan^2\phi_1}. \tag{59}$$

Equation (58) can be obtained as follows:

$$U^2 - 8TU + 16T = 0. \tag{60}$$

From this equation, U can be obtained as follows:

$$U = 4T \pm 4\sqrt{T(T-1)}. \tag{61}$$

Here, the double sign can be determined by the following manner. Since Q is expressed as $Q=c-d=c-c(1/z)=c\{(z-1)/z\}$ when $U=Q\cot\phi_1$, equation $c=Q\{z/(z-1)\}$ holds. From inequality (50), i.e., $c>2\sqrt{z}$, inequality $Qz/(z-1)>2\sqrt{z}$ holds. By multiplying both side of the inequality by $\cot\phi_1$ and rearranging, $$U = Q\cot\phi_1 > \frac{2\sqrt{z}(z-1)}{z}\cot\phi_1 \tag{62}$$

can be obtained. Further multiplying both sides of inequality (62) by $\tan\phi_1$ and rearranging, the following inequality can be obtained:

$$U\tan\phi_1 > 2\sqrt{z}\left(1-\frac{1}{z}\right). \tag{63}$$

Since inequality (63) holds whenever $\phi_2>\phi_1$, inequality (63) must hold when $\phi_2\to 90°$ with $\phi_1$ being fixed at 45°. In this case, $U\to\infty$ is obtained since, $$U > 2\sqrt{z}\left(1-\frac{1}{z}\right) \to \infty.$$

From equation (59), i.e., $T=\tan^2\phi_2/\tan^2\phi_1$, $T\to\infty$ if $\phi_2\to 90°$ is obtained. In this case, the reciprocal of the $U=4T-4\sqrt{T(T-1)}$ approaches ½, as shown below.

$$\frac{1}{U} = \frac{1}{4T-\sqrt{4T(T-1)}} = \frac{T+\sqrt{T(T-1)}}{4\{T^2-T(T-1)\}}$$

$$= \frac{1}{4} + \sqrt{(1/16)-(1/16T)} \to \frac{1}{2} \; (T\to\infty).$$

The relationship that $U\to\infty$ if $T\to\infty$ is not compatible with equation (63), so that negative sign for U in equation (61) does not exist. Accordingly, $$U = 4T + 4\sqrt{T(T-1)}. \tag{64}$$

From equation $x=Q\cot\phi$ and equation (31), equation:

$$U = 2 + \left(\lambda_2 + \frac{1}{\lambda_2}\right) \tag{65}$$

holds, so that the following quadratic equation for $\lambda_2$ can be obtained:

$$\lambda_2^2 - (U-2)\lambda_2 + 1 = 0. \tag{66}$$

By solving equation (66), $$\lambda_2 = \frac{(U-2)\pm\sqrt{U(U-4)}}{2} \tag{67}$$

can be obtained.

The double sign for $\lambda_2$ in equation (67) can be determined as follows. Here, let the double sign be a negative sign in equation (67). Since that $U\to\infty$ when $\phi_2\to 90°$ and that $\lambda_2>1$ hold as described before, $\lambda_2$ must be also infinite if $\phi_2\to 90°$. On the other hand, the reciprocal of equation (67) for $\lambda_2$ approaches infinity when $U\to\infty$ as follows:

$$\frac{1}{\lambda_2} = \frac{2}{(U-2)-\sqrt{U(U-4)}}$$

$$= \frac{(U-2)+\sqrt{U(U-4)}}{(U-2)^2-\sqrt{U(U-4)}}$$

$$= \frac{(U-2)+\sqrt{U(U-4)}}{2} \to \infty \; (U\to\infty).$$

Accordingly, it is found that $\lambda_2\to 0$ if $U\to\infty$, which is incompatible with that $\lambda_2\to\infty$ if $U\to\infty$ as described above, however. Accordingly, the double sign for $\lambda_2$ must assume a positive sign. Further, from equation (67), the following equation can be obtained:

$$\lambda_2^2 = \frac{U^2-4U+2+(U-2)\sqrt{U(U-4)}}{2}. \tag{68}$$

Hence, the value $\omega_{min}/W_{min}=\lambda_2^2$ can be obtained in terms of $\phi_1$ and $\phi_2$ from equations (59), (61) and (68).

Figure 18:
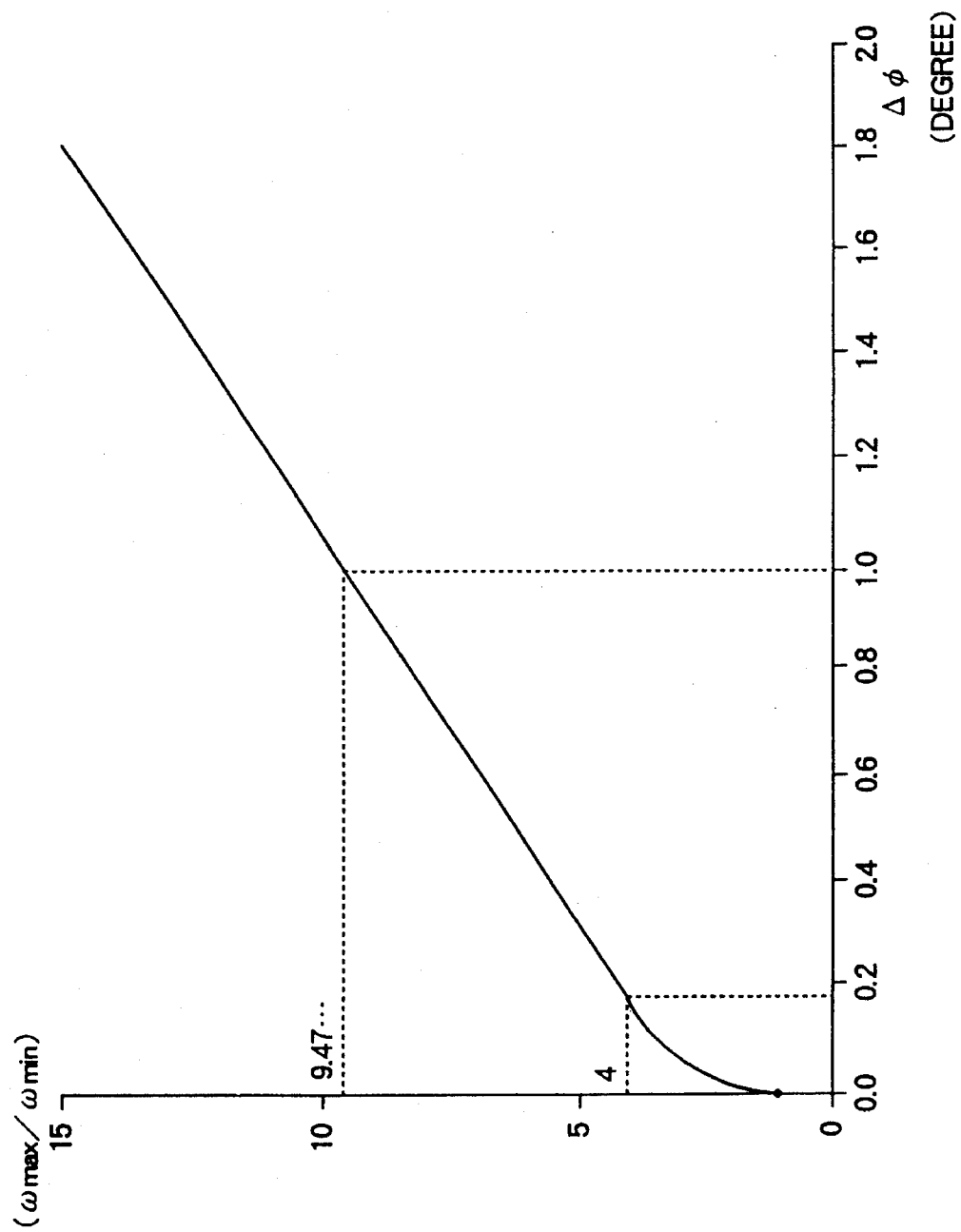
FIG. 18 is a graph showing the relationship between Δϕ and ($\omega_{max}/\omega_{min}$)

FIG. 18 provides a concrete example for values $\lambda_2^2=\omega_{min}/\omega_{max}$, in which $\lambda_2^2$ is varied by selecting a parameter $\Delta\phi$ (degree), wherein it is selected that $$\phi_1 45°-\Delta\phi/2 \text{ and } \phi_2=45°+\Delta\phi/2.$$

As can been seen from FIG. 18, by seleting the value for $\Delta\phi$, the ratio of the upper limit to the lower limit of a frequency range is determined so that variation of the phase characteristic can be maintained within $\Delta\phi$. Since $\phi_1$ is selected at 44.5° and $\phi_2$ is selected at 45.5° in the phase delay circuit 5 of FIG. 11, $\Delta\phi=\phi_2-\phi_1$ is set at 1° in the embodiment. In this case, $\omega_{max}/\omega_{min}$ is about 9.47, and consequently coincides with the calculated ratio $\omega_{max}/w_{min}=3.079/0.325=9.47$ directly calculated from the phase characteristic, taking the calculation errors into consideration.

Taken the relationship between $\Delta\phi$ and $\omega_{max}/\omega_{min}$ in FIG. 18 into consideration, $\Delta\phi$ can be selected at a smaller value from a desired value given for $\omega_{max}/\omega_{min}$ on the contrary. For example, when a phase delay circuit 5 in which $\Delta\phi$ is set at about 1° is employed, variation in the oscillation frequency for a constant control current can be ignored. In addition, if the quartz resonator X used in the feedback circuit 21 need not be replaced at all, the ratio $\omega_{max}/\omega_{min}$ can be determined taking account of variations in the absolute values of the resistors and capacitors in the phase delay circuit 5. That is, the ratio of the maximum value to the minimum value of the variation in the time constant due to the variations in the absolute values of the elements is preferably equal to the ratio $\omega_{max}/\omega_{min}$. Since it is a rare case that the actual time constant deviates from between half and double the design value, the ratio $\omega_{max}/\omega_{min}$ is preferably set at $2/(½)=4$. In this case, $\Delta\phi$ is not greater than $0.2°$, as shown in FIG. 18.

In the case where the oscillation frequency is expected to be drasticaly changed due to necessity of replacement of the quartz resonator X, the ratio $r_1$ of the maximum value to the minimum value among the series resonance frequencies of individual quartz resonators to be used, and the ratio $r_2$ of the maximum value to the minimum value of the variation in the time constant are both taken into consideration so that $\omega_{max}/\omega_{min}$ is equal to $r_1 \cdot r_2$. In this case, $\omega_S$ which determines the frequency characteristic of the transfer fucntions $A(\omega$ of the phase delay circuit 5 is preferably determined by geometrical means of the maximum value $\omega_{S1}$ and the minimum value $\omega_{S2}$ among the series resonance frequencies of the quartz resonators:

$$\omega_s = \sqrt{\omega_{s1} \cdot \omega_{s2}} \ .$$

By the setting as described above, so that $\Delta\phi$ can be set as small as possible even in the case where the quartz resonator X is replaced.

In the above-described manner, the allowble range of $\Delta\phi$ of the phase characteristic of the phase delay circuit 5 is determined taking account of the replacement of the quartz resonator or the range of variations in the absolute values of the resisters and capacitors. If conditions are such that the variation in the oscillation frequency due to $\Delta\phi$ generated by a given constant control signal remains within an allowable range, all the constants "a", "b" and $\omega_S$ providing the frequencey characteristic $A(\omega)$ are set at proper values.

Figure 19:
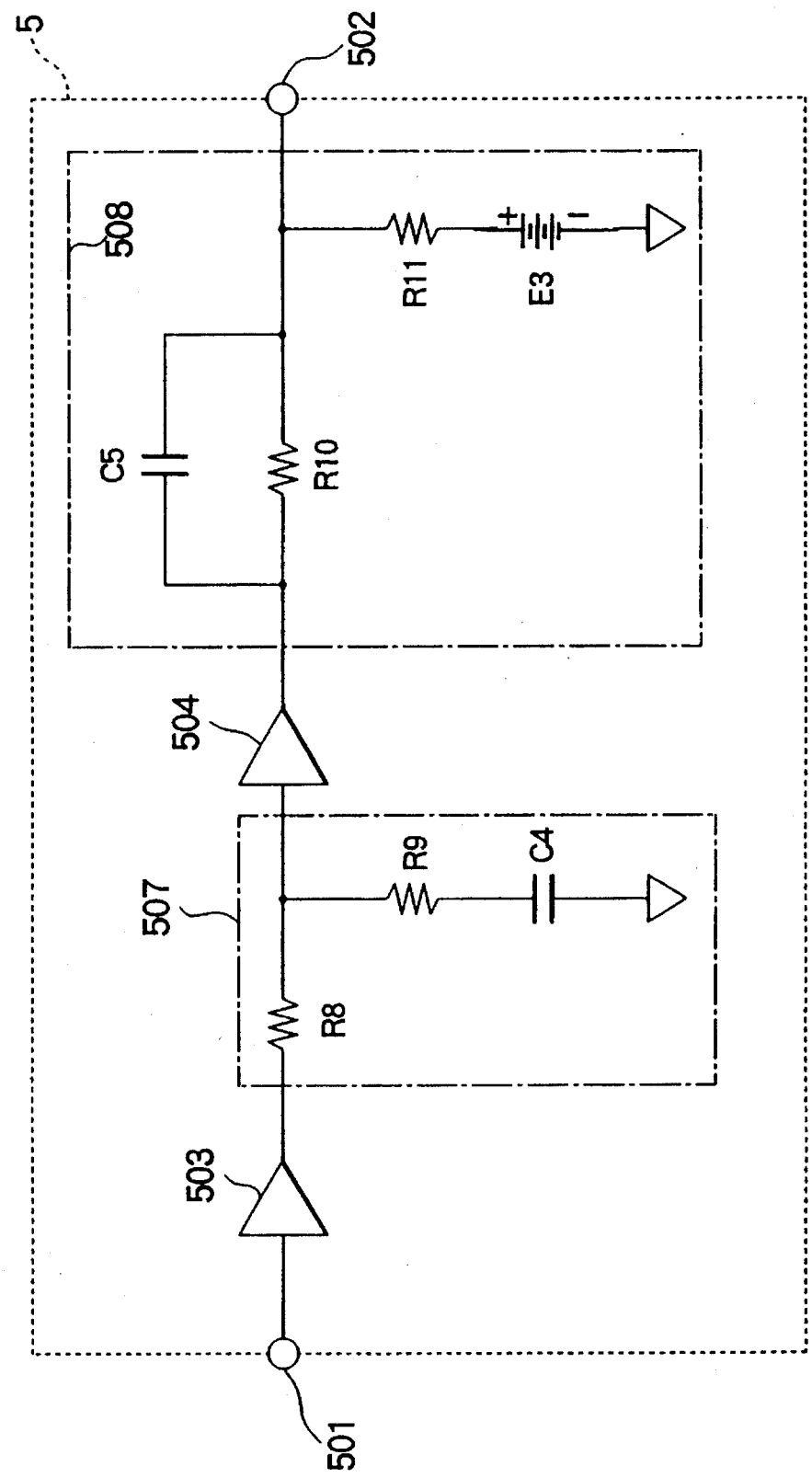
FIG. 19 is a circuit diagram of a phase delay circuit in an oscillation circuit according to a second embodiment of the present invention.

The phase shift circuit can be realized by a different circuit structure as shown in FIG. 19. FIG. 19 shows a phase delay circuit 5A for use in an oscillation circuit according to a second embodiment of the present invention. Elements in FIG. 19 having the same functions as those of corresponding elements of the phase delay circuit 5 of FIG. 11 are designated by the same symbols or reference numbers for the sake of understanding.

The phase delay circuit 5A comprises a first buffer amplifier 503 receiving the first signal e1, a first filter 507 including a resistor R8 having a first terminal connected to the output of the buffer amplifier 503, a series circuit of a resistor R9 and a capacitor C4 connected between a second terminal of resistor R8 and ground, a second buffer amplifier 504 having an input connected to the second terminal of resistor R8, a second filter including a parallel circuit of a resistor R10 and a capacitor C5 connected between the output of the second buffer amplifier 504 and an output terminal 502 and a resistor R11, and a voltage source E3 connected between output terminal 502 and ground. The voltage of the voltage source E3 is set to be equal to the voltage of the voltage source E1 shown in FIG. 10 so as to make the DC bias voltage at output terminal 502 equal to the DC bias voltage at input terminal 501.

The transfer function $A(w)$ of the phase shift circuit 5A is expressed by the following equation:

$$A(\omega) = 8 \cdot \frac{R11}{R10 + R11} \cdot \frac{1 + j\omega C4 \cdot R9}{1 + j\omega C4 \cdot (R8 + R9)} \cdot \quad (69)$$

$$\frac{1 + j\omega C5 \cdot R10}{1 + j\omega C5 \cdot R10 \cdot R11/(R10 + R11)}$$

where $C4 \cdot R8$, $C4 \cdot R9$, $C5 \cdot R10$, and $C5 \cdot R11$ are determined from the series resonance frequency $\omega_S$ of a quartz resonator X and constants "a" and "b" (a>b>1) as follows:

$$C4 \times R8 = \left(a - \frac{1}{a}\right) \times \frac{1}{\omega_s} \quad (70)$$

$$C4 \times R9 = \frac{1}{a} \times \frac{1}{\omega_s} \quad (71)$$

$$C5 \times R10 = b \times \frac{1}{\omega_s} \quad (72)$$

$$C5 \times R11 = \frac{b}{b^2 - 1} \times \frac{1}{\omega_s} \ . \quad (73)$$

From the above relationship, the phase characteristic $\angle A(\omega)$ of the transfer function $A(\omega)$ can be expressed as follows:

$$\angle A(\omega) = -\tan^{-1}\left(\frac{a\omega}{\omega_s}\right) + \quad (74)$$

$$\tan^{-1}\left(\frac{b\omega}{\omega_s}\right) - \tan^{-1}\left(\frac{\omega}{b\omega_s}\right) + \tan^{-1}\left(\frac{\omega}{a\omega_s}\right).$$

Equation (74) is the same as equation (13), thereby indicating that the phase delay circuit shown in FIG. 19 exhibits the same phase characteristic as the phase delay circuit shown in FIG. 11 when the values for "a" and "b" are the same. In other words, the phase characteristic shown in FIG. 16 can be obtained when the transfer function of the phase shift circuit is set by using constants "a" and "b" (a>b>1), $\omega_S$, and A, as follows:

$$A(\omega) = A \times \frac{\left(1 + j\frac{b\omega}{\omega_s}\right)\left(1 + \frac{\omega}{a\omega_s}\right)}{\left(1 + j\frac{a\omega}{\omega_s}\right)\left(1 + \frac{\omega}{b\omega_s}\right)} \quad (75)$$

regardless of the apparent difference in a circuit structure of the phase shift circuit.

Further, since the buffer amplifiers 503 and 504 (shown in FIG. 11 and FIG. 19) of the phase delay circuits as well as the limiter circuit 6 of FIG. 5 actually have a limited frequency band, there is an extra time constant accompanied thereby although the extra time constant itself is extremely small as compared to the time constant determined by the resistors and capacitors forming the phase delay circuit 5. That is, a slight phase delay is additionally produced by the buffer amplifiers etc. However, the phase characteristic of the phase shift circuits 5 an 5A can be finely adjusted so as to make the phase characteristic thereof approximately the same as the design phase characteristic calculated in an ideal condition, taking the extra phase delay into consideration. The ideal phase characteristic $\angle A(\omega)$ is, for example, expressed as follows:

$$\angle A(\omega) = -\tan^{-1}\left(\frac{a\omega}{\omega_s}\right) + \quad (76)$$

$$\tan^{-1}\left(\frac{b\omega}{\omega_s}\right) - \tan^{-1}\left(\frac{\omega}{b\omega_s}\right) + \tan^{-1}\left(\frac{\omega}{a\omega_s}\right)$$

wherein a>b>1. Since the additional time constant causing the extra phase delay is very small, the extra phase delay can be expressed as $-\tan^{-1}(\omega/\omega_C)$ in tems of $\omega_C$ ($\omega_C \neq \omega_S$). The influence of the extra phase delay is at a maximum when $\omega$ is at a maximum. In this case, the variation of $\angle A(\omega)$ is substantially determined by the dominating fourth term of the right-hand side, i.e., $+\tan^{-1}(\omega/a\omega_S)$ of equation (76). Accordingly, the extra phase delay can be cancelled by adjusting this term. In this case, since it is considered that $+\tan^{-1}(\omega/a\omega_S)$ is equal to the sum of a corrected expression $+\tan^{-1}(\omega/a_1\omega_S)$ and an expression $-\tan^{-1}(\omega/\omega_C)$, wherein $a_1$ is approximately equal to "a", the following equation holds:

$$\tan^{-1}\left(\frac{\omega}{a\omega_s}\right) = \tan^{-1}\left(\frac{\omega}{a_1\omega_s}\right) - \tan^{-1}\left(\frac{\omega}{\omega_c}\right). \tag{77}$$

By eliminating tan−1( ) from equation (77), the following equation can be obtained:

$$\frac{\omega}{a\omega_s} = \frac{\left(\frac{1}{a_1\omega_s} - \frac{1}{\omega_c}\right)\omega}{1 + \frac{\omega^2}{a_1\omega_s \times \omega_c}} \tag{78}$$

$$= \left(\frac{1}{a_1\omega_s} - \frac{1}{\omega_c}\right)\omega\left\{1 - \left(\frac{\omega^2}{a_1\omega_s\omega_c}\right)^2 + \ldots\right\}.$$

By ignoring the term of $\omega^3$ and terms of higher-order, dividing both sides by $\omega$ and rearranging the resultant equation, the following equation is obtained:

$$a_1 = \frac{a}{1 + a \times \frac{\omega_s}{\omega_c}}. \tag{79}$$

By modifying the fourth term of equation (76) using $a_1$, the following equation is obtained:

$$\angle A(\omega) = -\tan^{-1}\left(\frac{a\omega}{\omega_s}\right) + \tag{80}$$

$$\tan^{-1}\left(\frac{b\omega}{\omega_s}\right) - \tan^{-1}\left(\frac{\omega}{b\omega_s}\right) + \tan^{-1}\left(\frac{\omega}{a_1\omega_s}\right).$$

The phase characteristic $\angle A(\omega)$ can be readily implemented by utilizing the following transfer function $A(\omega)$:

$$A(\omega) = A \times \frac{\left(1 + j\frac{b\omega}{\omega_s}\right)\left(1 + j\frac{\omega}{a_1\omega_s}\right)}{\left(1 + j\frac{a\omega}{\omega_s}\right)\left(1 + j\frac{\omega}{b\omega_s}\right)}. \tag{81}$$

Comparing equation (81) with equation (7) teaches that equations (7) and (81) are made identical to each other, by replacing C3·R7 by $1/a_1\omega_s$, C3·(R6+R7) with $1/b\omega_s$, and A with 8 in equation (81). Accordingly, C3·R6 and C3·R7 can be expressed as follows:

$$C3 \times R6 = \left(\frac{1}{b} - \frac{1}{a_1}\right)\frac{1}{\omega_s} \tag{82}$$

$$C3 \times R7 = \frac{1}{a_1} \times \frac{1}{\omega_s}. \tag{83}$$

By selecting C3·R6 and C3·R7 in accordance with equations (82) and (83), it is possible to substantially cancel the extra phase delay produced in the phase delay circuit 5 shown in FIG. 11 due to the extra phase delay of the buffer amplifiers 503 and 504 included in the phase delay circuit 5 and the first limiter circuit 6 shown in FIG. 10.

Although the present invention is described with reference to the preferred embodiments, the present invention is not limited to such embodiments and it will be obvious for those skilled in the art that various modifications or alterations can be easily made based on the above embodiments within the scope of the present invention.

What is claimed is:

1. An oscillation circuit comprising: a phase shift circuit, including a low-pass filter having a significant transfer gain at any frequency, for receiving a first signal to output a second signal having a first phase shift relative to the phase of said first signal, said phase shift being substantially different from 90°; a first limiter circuit for receiving said second signal to output a third signal having a first amplitude and remaining in phase with said second signal; a second limiter circuit for receiving said first signal and a control signal to output a fourth signal, said fourth signal being substantially in phase with said first signal and having a second amplitude controlled by said control signal; an adding section for adding said third signal and said fourth signal to output a fifth signal; and a feedback circuit, including a resonance circuit having a resonant frequency within a frequency band, for receiving said fifth signal to output said first signal having a second phase shift relative to the phase of said fifth signal, said second phase shift being a function of the frequency of said fifth signal.

2. An oscillation circuit as defined in claim 1 wherein said control signal is a current signal.

3. An oscillation circuit as defined in claim 1 wherein said first phase shift is approximately equal to 45°.

4. An oscillation circuit as defined in claim 1 wherein said phase shift circuit is implemented in an integrated circuit.

5. An oscillation circuit as defined in claim i wherein said oscillation circuit is implemented by an integrated circuit.

6. An oscillation circuit as defined in claim 1 wherein said resonance circuit is a series resonance circuit.

7. An oscillation circuit as defined in claim 6 wherein said feedback circuit includes a quartz resonator.

8. An oscillation circuit as defined in claim 7 wherein said second phase shift linearly varies with the variation of said fifth signal.

9. A current-controlled phase shift circuit for use in an oscillation circuit comprising a phase delay circuit, having a significant transfer gain at any frequency, for receiving a first signal to output a second signal having a fixed phase delay relative to the phase of said first signal, said phase delay being substantially different from 90°; a first limiter circuit for receiving said second signal to output a third signal having a first amplitude and remaining in phase with said second signal; a second limiter circuit for receiving said first signal and a control signal to output a fourth signal, said fourth signal being substantially in phase with said first signal and having a second amplitude controlled by said control signal; an adding section for adding said third signal and said fourth signal.

\* \* \* \* \*

UNITED STATES PATENT AND TRADEMARK OFFICE
CERTIFICATE OF CORRECTION

PATENT NO. : 5,485,128
DATED : January 16, 1996
INVENTOR(S) : Kunihiko AZUMA

It is certified that error appears in the above-indentified patent and that said Letters Patent is hereby corrected as shown below:

Claim 5, line 30, Col. 22, "i" should be "1".

Signed and Sealed this

Ninth Day of July, 1996

BRUCE LEHMAN

*Attest:*

*Attesting Officer*    Commissioner of Patents and Trademarks